United States Patent
Miyazaki et al.

(10) Patent No.: US 8,241,980 B2
(45) Date of Patent: Aug. 14, 2012

(54) SEMICONDUCTOR DEVICE AND MANUFACTURING METHOD THEREOF

(75) Inventors: Yukimasa Miyazaki, Kawasaki (JP); Kouichi Nagai, Kawasaki (JP); Hideaki Kikuchi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 147 days.

(21) Appl. No.: 12/500,262

(22) Filed: Jul. 9, 2009

(65) Prior Publication Data

US 2010/0001372 A1 Jan. 7, 2010

Related U.S. Application Data

(63) Continuation of application No. PCT/JP2007/056358, filed on Mar. 27, 2007.

(51) Int. Cl.
*H01L 21/8242* (2006.01)
(52) U.S. Cl. .............................. 438/240; 438/3
(58) Field of Classification Search ........ 438/3, 238–241, 438/245–256, 393–399
See application file for complete search history.

(56) References Cited

U.S. PATENT DOCUMENTS

| | | | |
|---|---|---|---|
| 6,228,755 B1 | 5/2001 | Kusumi et al. | |
| 6,951,788 B2 * | 10/2005 | Ohyagi | 438/240 |
| 7,547,558 B2 * | 6/2009 | Okita et al. | 438/3 |
| 2003/0143805 A1 | 7/2003 | Okudaira | |
| 2003/0211685 A1 | 11/2003 | Ohyagi | |
| 2003/0227046 A1 | 12/2003 | Ando et al. | |
| 2005/0274690 A1 * | 12/2005 | Park et al. | 216/17 |
| 2006/0038217 A1 | 2/2006 | Mikawa et al. | |
| 2007/0114590 A1 | 5/2007 | Ando et al. | |

FOREIGN PATENT DOCUMENTS

| | | |
|---|---|---|
| JP | 08-083843 A | 3/1996 |
| JP | 2000-091428 A | 3/2000 |
| JP | 2003-224207 A | 8/2003 |
| JP | 2003-332536 A | 11/2003 |
| JP | 2004-146772 A | 5/2004 |
| JP | 2004-179194 A | 6/2004 |
| JP | 2006-156932 A | 6/2006 |
| WO | 98-01895 A1 | 1/1998 |

OTHER PUBLICATIONS

International Search Report of PCT/JP2007/056358, Mailing Date of Jun. 19, 2007.
Notification of Transmittal of Translation of the International Preliminary Report of Patentability (Form PCT/IB/338) of International Application No. PCT/JP2007/056358 mailed Oct. 29, 2009 with Forms PCT/IB/373 and PCT/ISA/237.

* cited by examiner

*Primary Examiner* — Telly Green
(74) *Attorney, Agent, or Firm* — Westerman, Hattori, Daniels & Adrian, LLP

(57) ABSTRACT

Stable contact hole forming is attained even when an aluminum oxide film is present between layers provided with contact holes. The process comprises the steps of forming a first element layer on a semiconductor substrate; forming a first interlayer insulating film on the first element layer; forming a second element layer on the first interlayer insulating film; forming a second interlayer insulating film on the second element layer; forming a hole resist pattern on the second interlayer insulating film; conducting a first etching for forming of holes by etching the second interlayer insulating film; and conducting a second etching for extending of holes to the first element layer by etching the first interlayer insulating film.

33 Claims, 35 Drawing Sheets

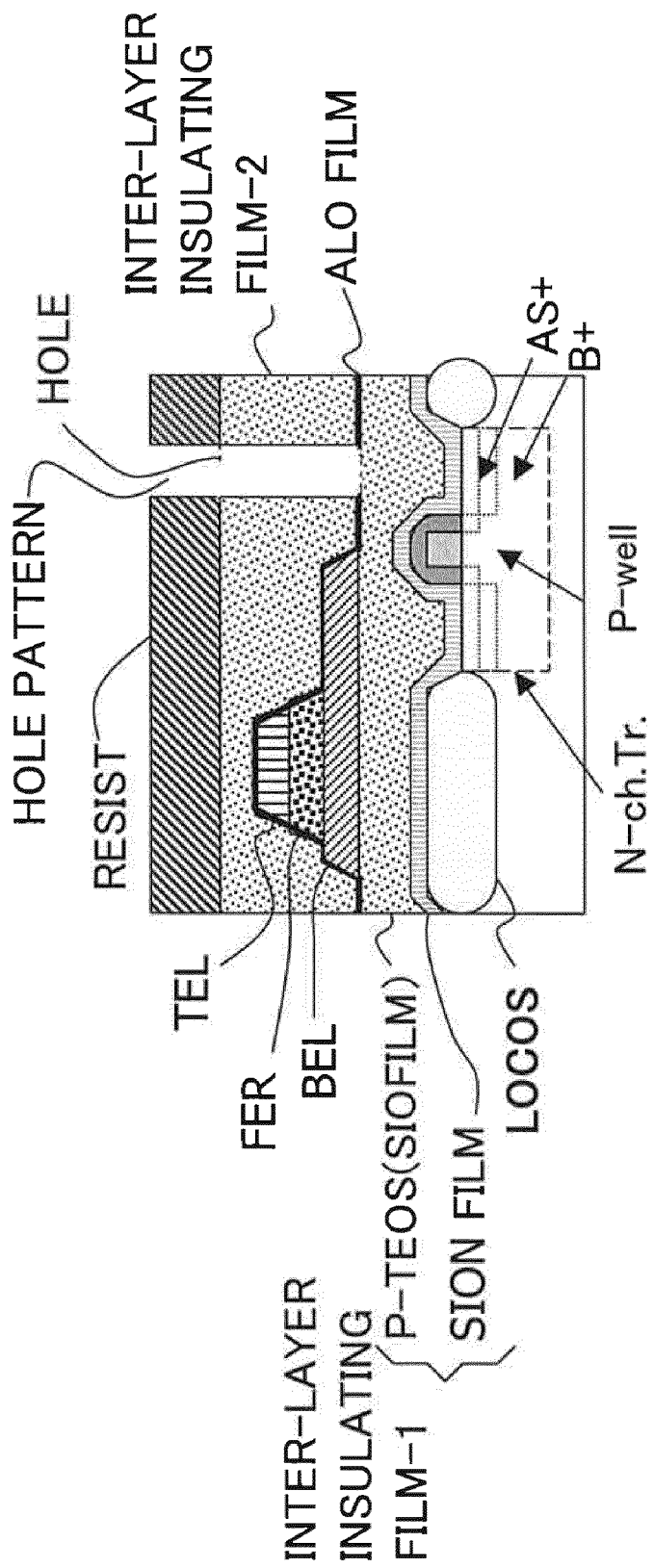

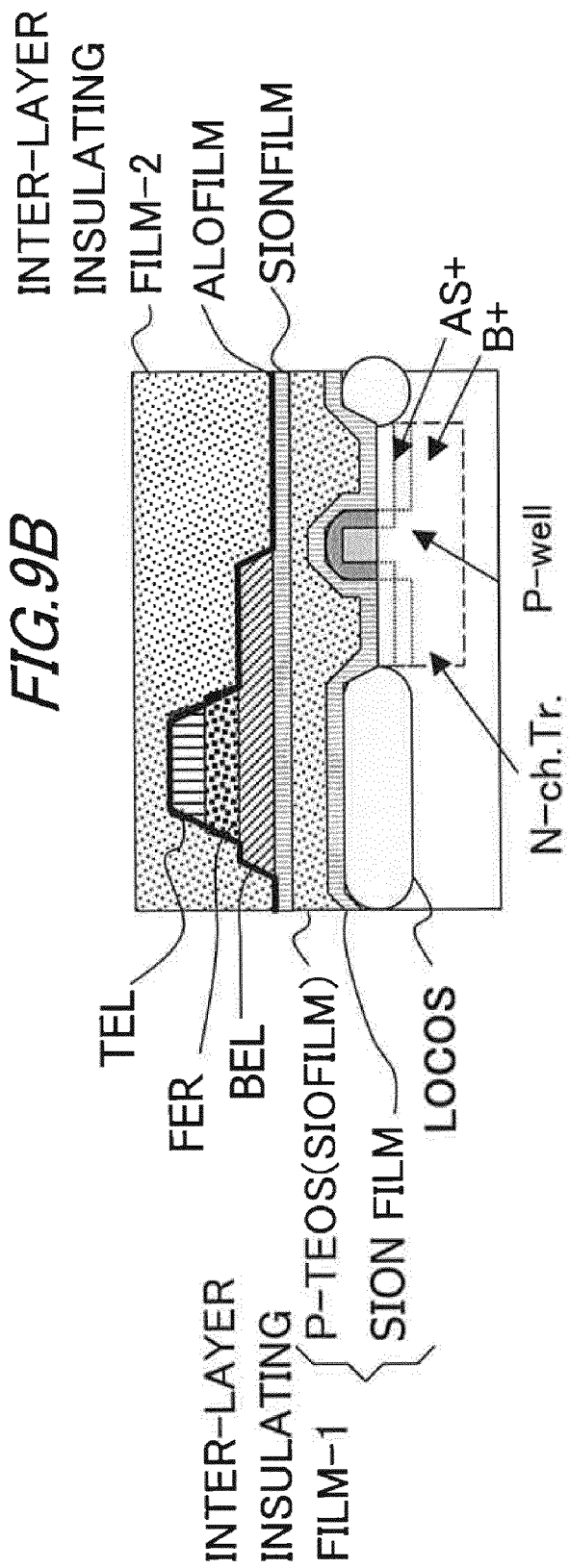

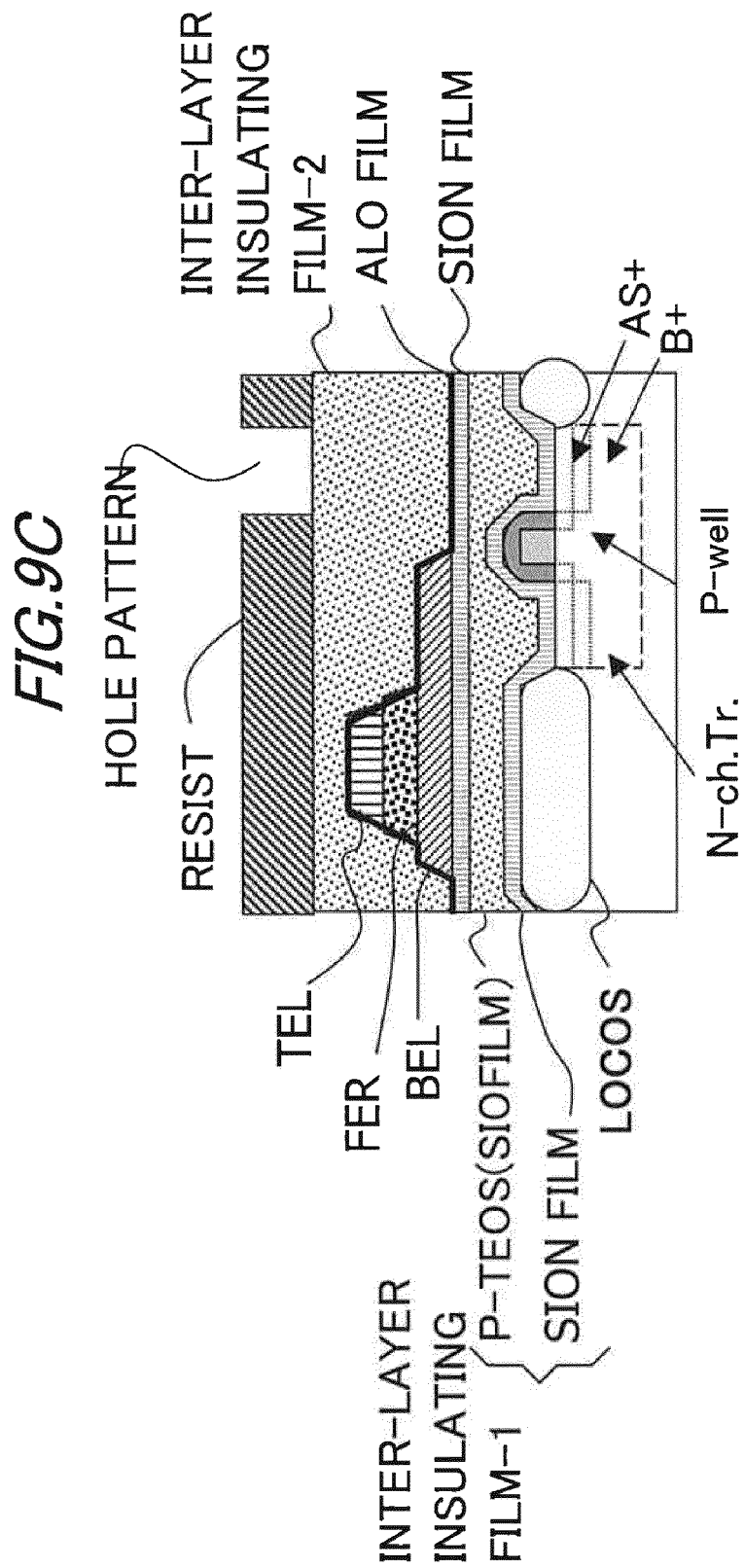

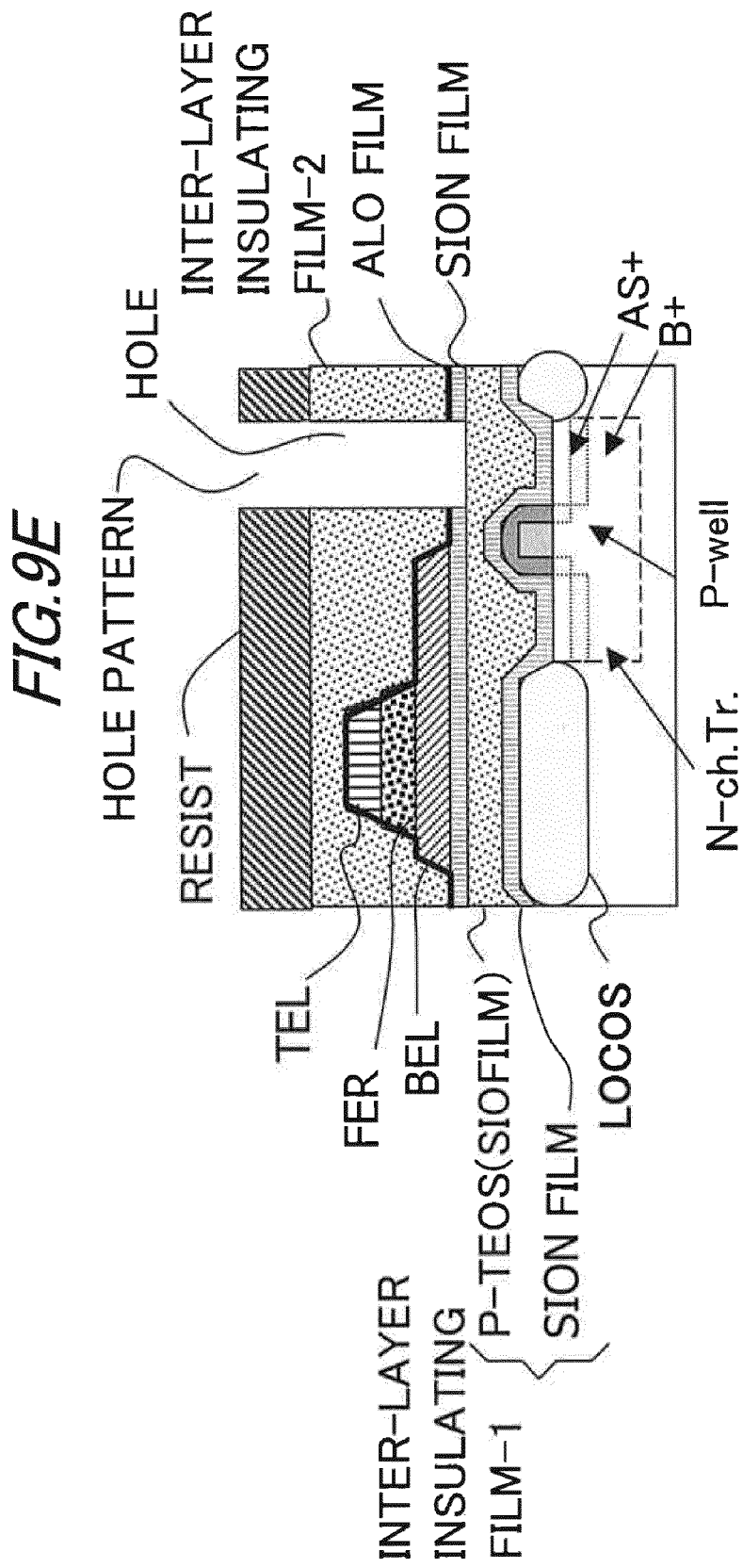

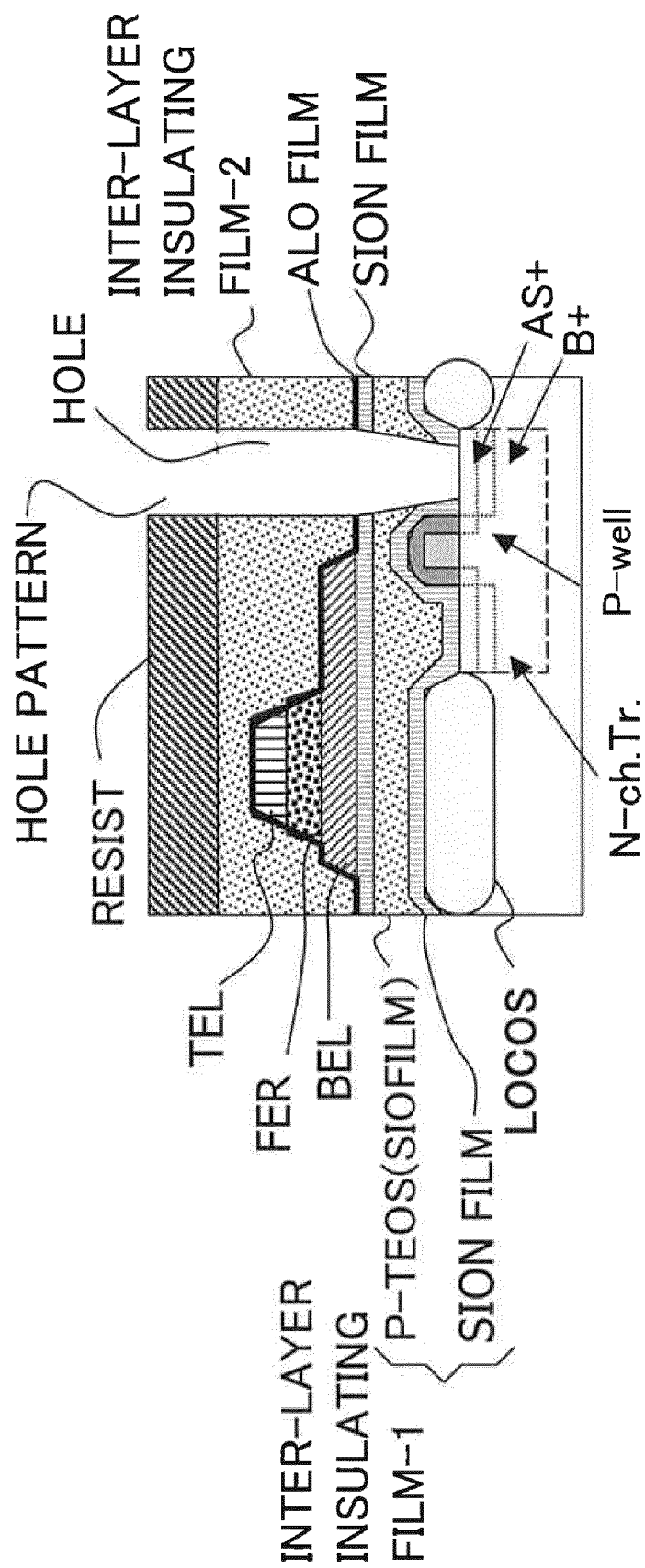

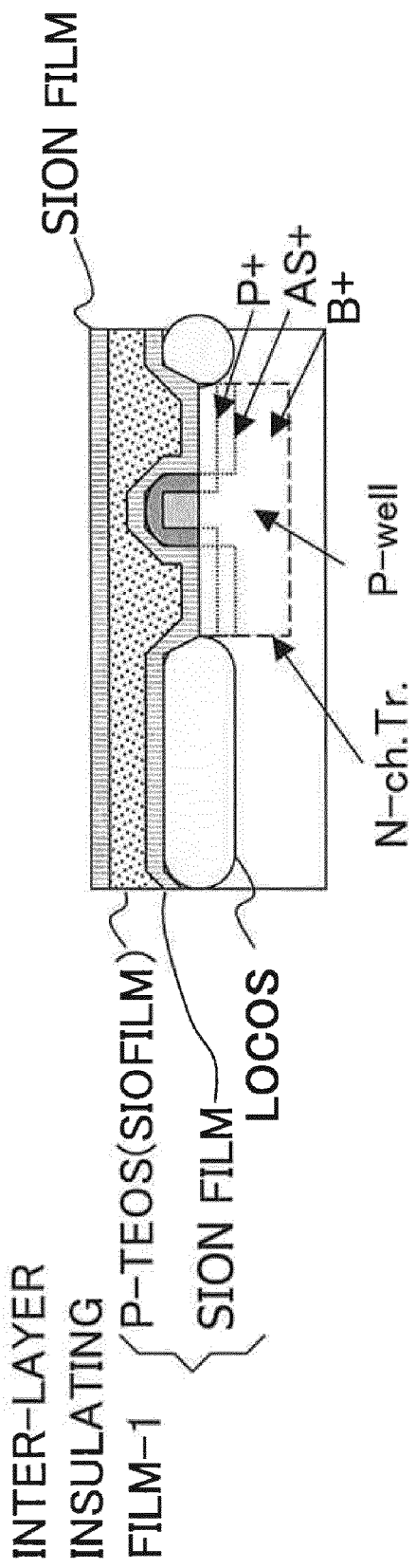

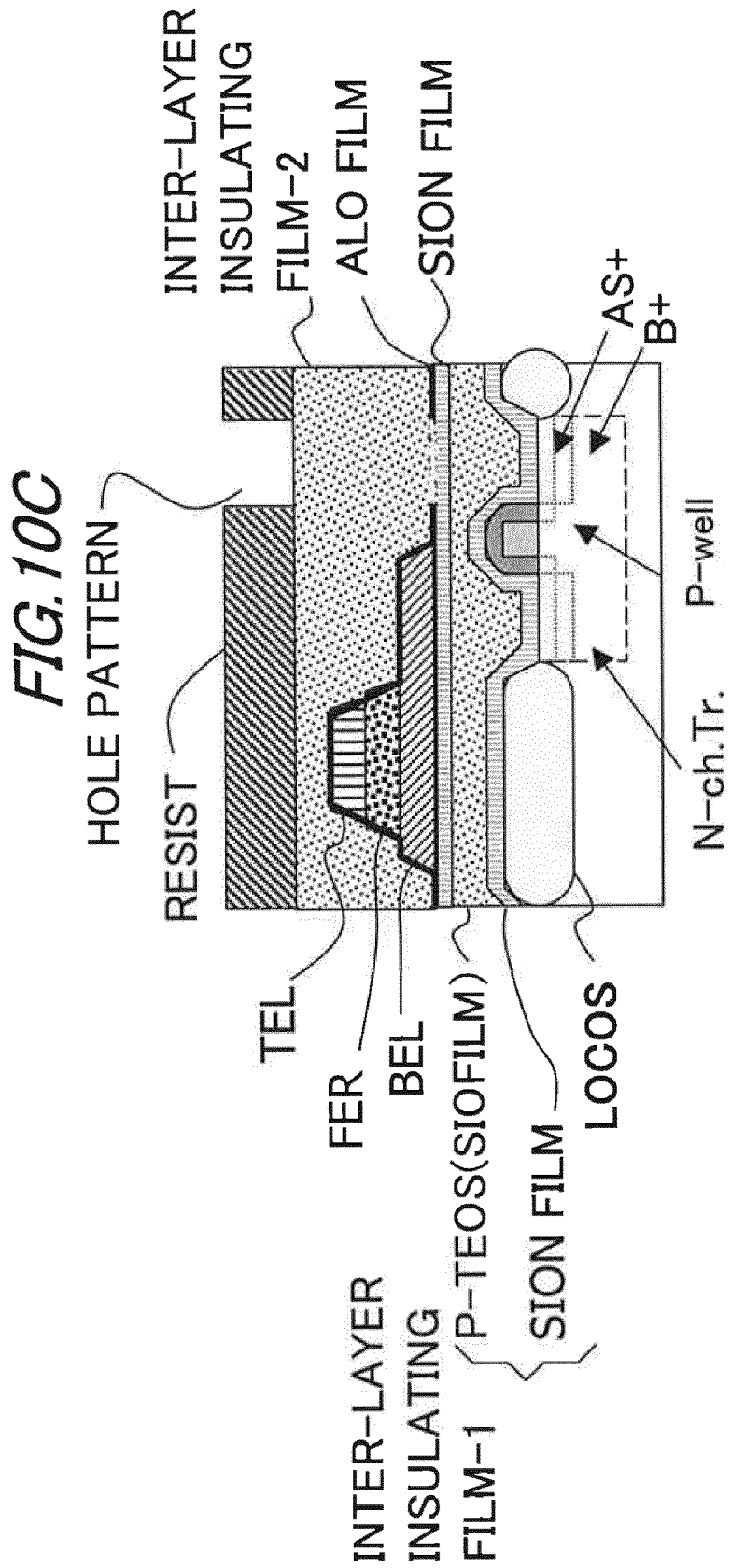

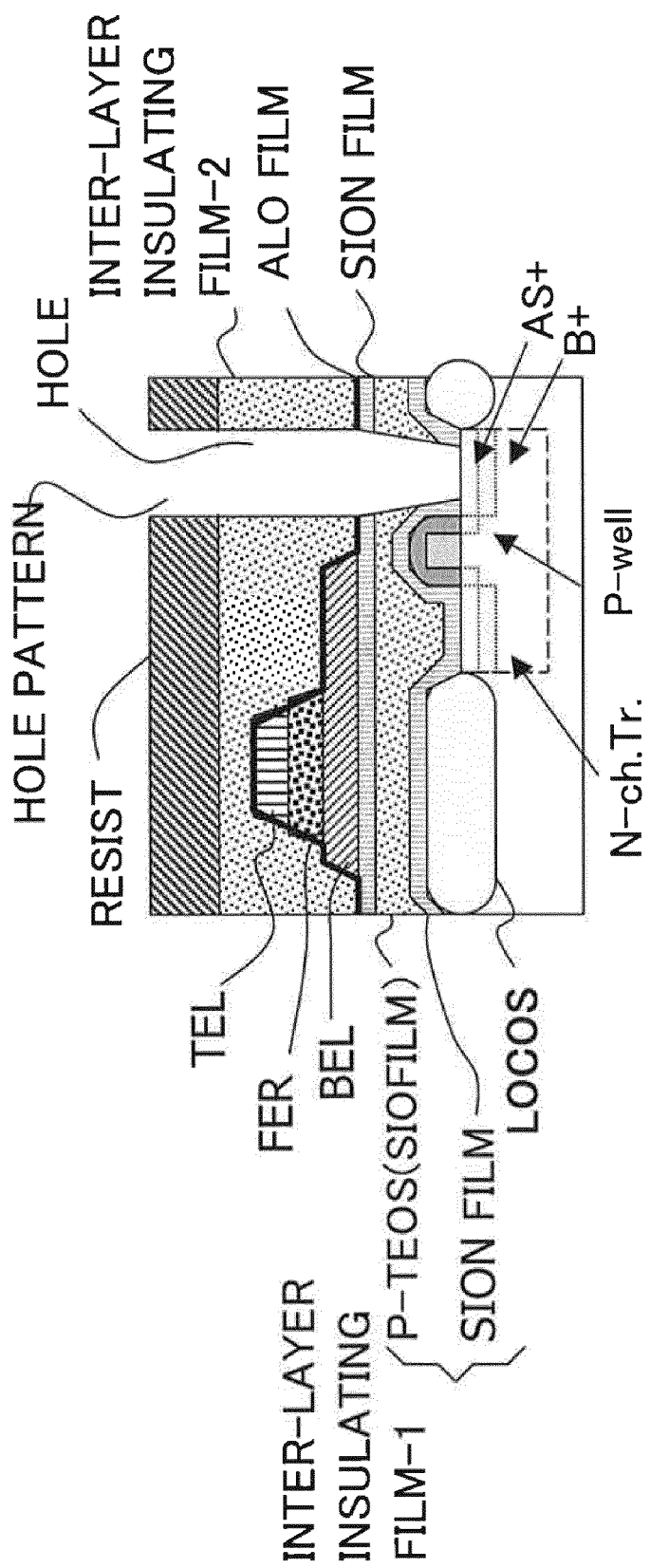

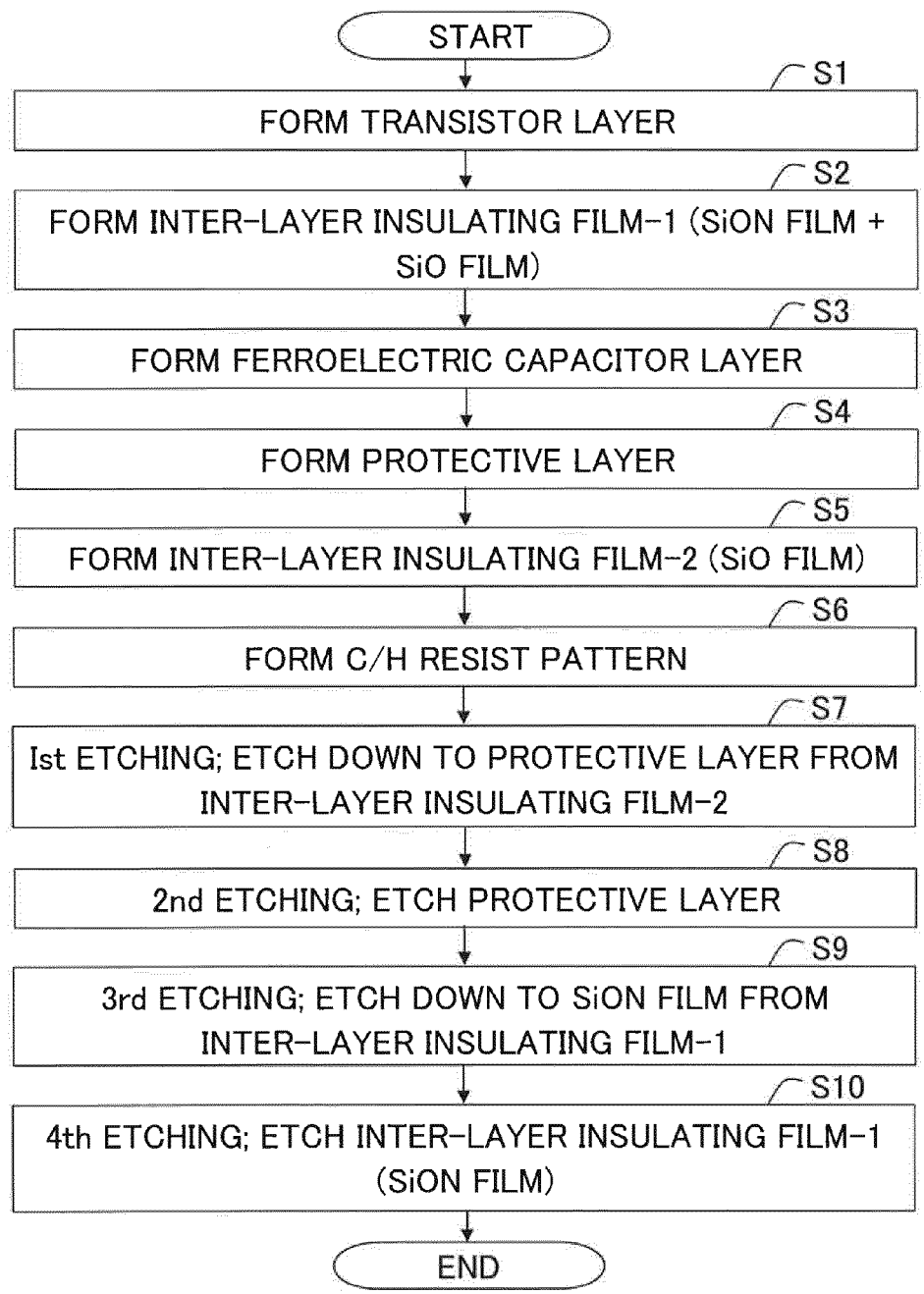

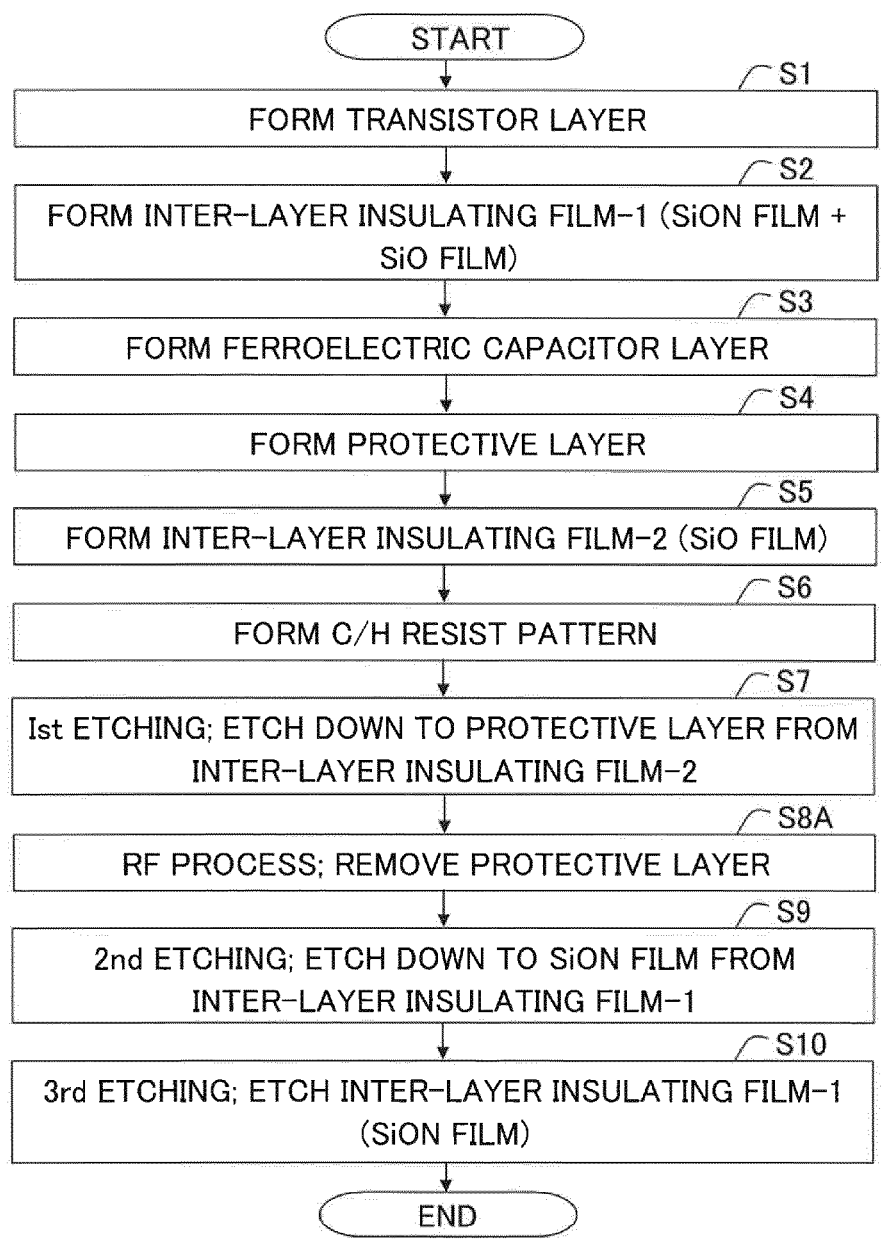

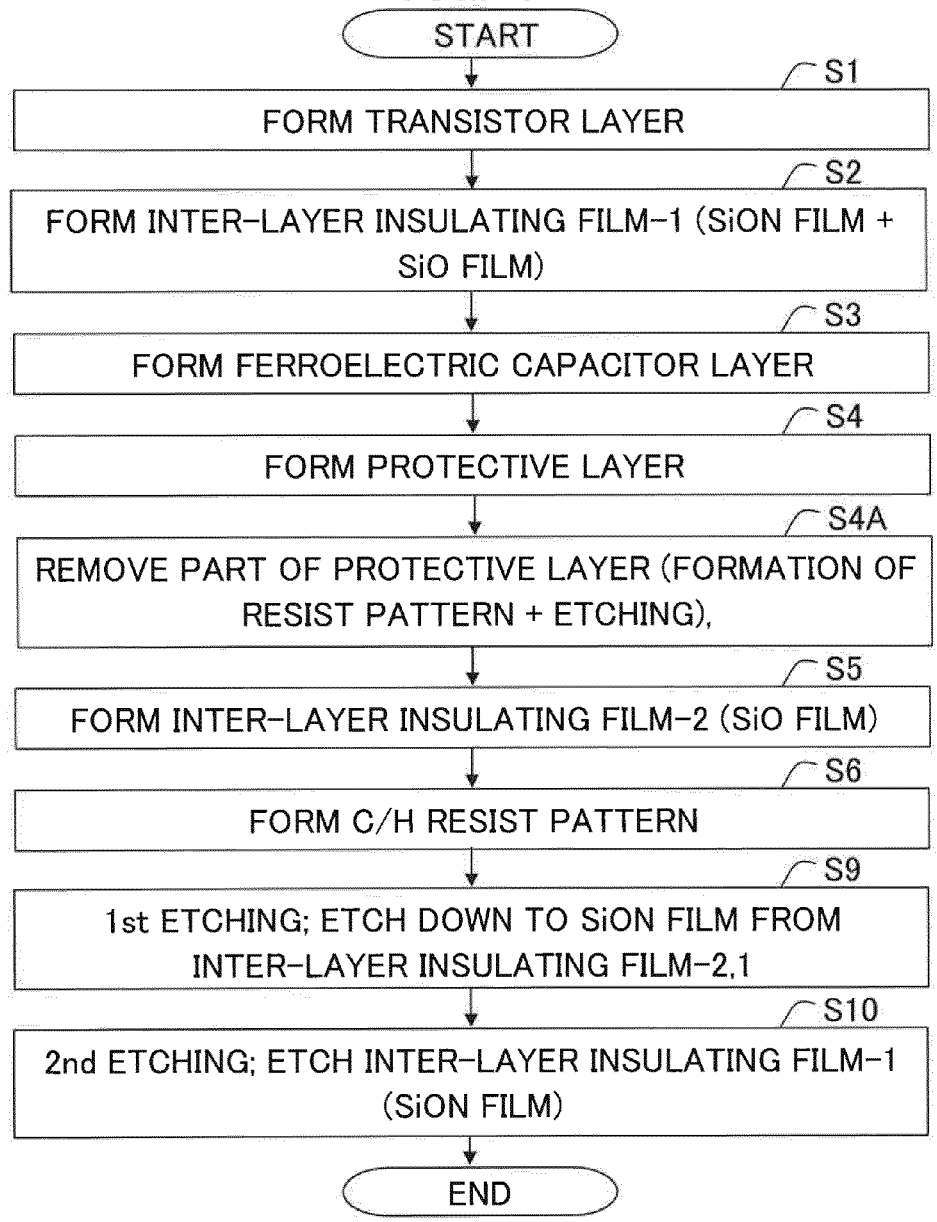

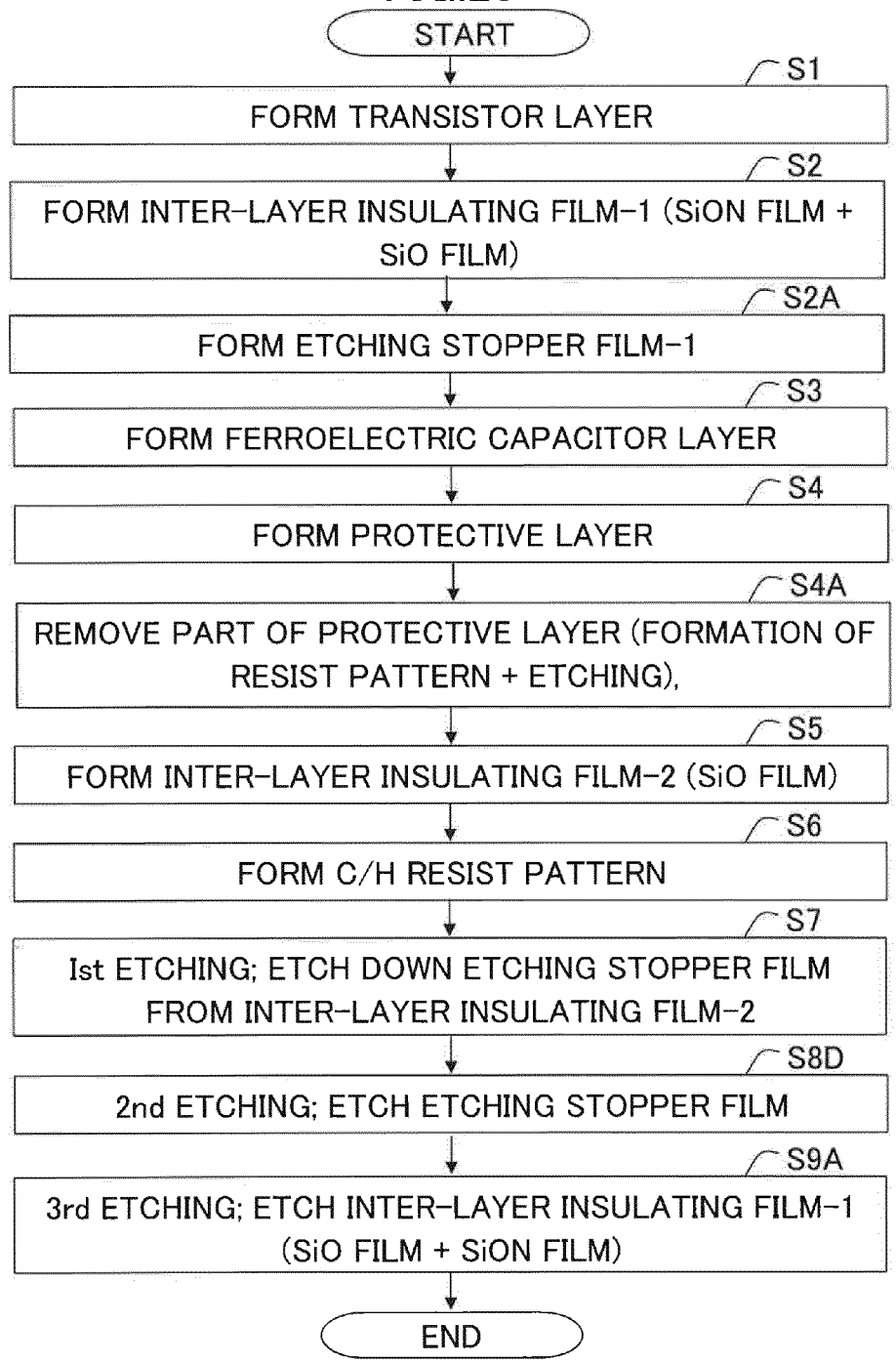

SEMICONDUCTOR DEVICE AND MANUFACTURING METHOD THEREOF

CROSS-REFERENCE TO RELATED APPLICATION

This is a continuation of Application PCT/JP2007/056358, filed on Mar. 27, 2007, now pending, the contents of which are herein wholly incorporated by reference.

FIELD

The present invention relates generally to a semiconductor device and a manufacturing method thereof, and more particularly to semiconductor device including a ferroelectric capacitor and a manufacturing method thereof.

BACKGROUND

Over the recent years, there has been advanced development of a ferroelectric memory (FeRAM) which retains information on a ferroelectric capacitor by utilizing an inversion of polarization of a ferroelectric substance. The ferroelectric memory is a nonvolatile memory from which the retained information thereof does not disappear even when switching off a power source, and is focused particularly because of its being capable of realizing high integration, high-speed drive, high durability and low power consumption.

A material of a ferroelectric film in the ferroelectric capacitor includes, for example, a ferroelectric oxide having a Perovskite crystalline structure, such as a PZT (Pb (Zr, Ti)$O_3$) film and a SBT (SrBi$_2$Ta$_2$O$_9$) film on the order of 10-30 $\mu C/cm^2$, which has a large quantity of residual polarization. It has hitherto been known that this type of ferroelectric film is deteriorated in terms of a characteristic of the ferroelectric substance due to a water content getting permeated from outside via an inter-layer insulating film exhibiting a high affinity with the water such as a silicon oxide film. Namely, the permeated water content or the water content remaining in the film is dissolved into hydrogen and oxygen in a high-temperature process when the inter-layer insulating film and a metal wiring film are grown. Then, if the hydrogen permeates the ferroelectric film, the hydrogen reacts on the oxygen in the ferroelectric film, and an oxygen defect is formed in the ferroelectric film, with the result that crystallinity declines. Further, the same phenomenon occurs also from long-term use of the ferroelectric memory. As a result, there occurs deterioration of performance of the ferroelectric capacitor, such as decreases in quantity of the residual polarization and in dielectric constant of the ferroelectric film. Further, the performance of a transistor etc might be deteriorated without being limited to the ferroelectric capacitor.

Aluminum oxide $Al_2O_3$ for preventing the permeation of the water content and the hydrogen has hitherto been used for coping with the deterioration such as this. For example, a conventional technology is that the aluminum oxide is formed so as to cover the ferroelectric capacitor, and protects the ferroelectric capacitor so that the water content and the hydrogen do not permeate an interior of the ferroelectric substance. For example, as in FIGS. 3 through 6, the following processes are carried out.

(1) After forming the ferroelectric capacitor, an aluminum oxide film (which is also referred to as an AlO film) is formed so as to embrace the ferroelectric capacitor, thereafter, the aluminum oxide film is covered with an inter-layer insulating film, and the surface is flattened (FIG. 3).

(2) A resist is coated, and a resist pattern becoming a mask when forming a bulk contact hole is formed (FIG. 4).

(3) With the resist pattern serving as the mask, the bulk contact hole is formed by etching (FIGS. 5 and 6).

FIGS. 1 and 2 illustrate a problem of the contact hole formed in these processes. As in FIGS. 1 and 2, a shape and a depth of the hole formed by etching become ununiform at the center of the wafer and in the periphery of the wafer as the case may be.

Further, the ferroelectric capacitor is formed generally between a transistor layer and a wiring layer, and hence the bulk contact hole connecting the transistor layer to the wiring layer has an extremely high aspect. Moreover, FIG. 1 exemplifies a planar type ferroelectric capacitor, however, this problem similarly occurs in a stack type ferroelectric capacitor.

[Patent document 1]
International Publication WO98/01895
[Patent document 2]
Japanese Patent Laid-Open Publication No. 2006-156932
[Patent document 3]
Japanese Patent Laid-Open Publication No. 2003-224207

SUMMARY

An aspect of the embodiment is devised for solving the problems given above. The aspect of the embodiment is a manufacturing method of a semiconductor device, comprising: forming a first element layer on a semiconductor substrate; forming a first inter-layer insulating film on the first element layer; forming a second element layer on the first inter-layer insulating film; forming a second inter-layer insulating film on the second element layer; forming a resist pattern of a hole on the second inter-layer insulating film; forming the hole by etching the second inter-layer insulating film; and extending the hole down to the first element layer by etching the first inter-layer insulating film.

The object and advantage of the embodiment will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF DRAWINGS

FIG. 7D is a view illustrating a process of removing a protective layer (AlO film) by etching;

FIG. 9B is a view illustrating how an inter-layer insulating film-2 is formed;

FIG. 9C is a view illustrating how a resist pattern is formed;

FIG. 9E is a view illustrating how the SiON film is etched.

FIG. 9F is a view illustrating how the inter-layer insulating film-1 is taper-etched.

FIG. 10A is a view illustrating how the SiON film becoming the etching stopper is formed;

FIG. 10C is a view illustrating how a resist pattern is formed;

FIG. 10F is a view illustrating how the inter-layer insulating film-1 is taper-etched;

FIG. 11 is a flowchart illustrating a manufacturing process of a semiconductor device according to a first embodiment;

FIG. 12 is a flowchart illustrating a manufacturing process of the semiconductor device according to a fourth modified example of the first embodiment;

FIG. 19 is a flowchart illustrating a manufacturing process of the semiconductor device according to a first modified example of the third embodiment;

FIG. 20 is a flowchart illustrating a manufacturing process of the semiconductor device according to a fourth embodiment;

DESCRIPTION OF EMBODIMENT(S)

In the processes of FIGS. 3-6, the etching is conducted batchwise from the ferroelectric capacitor layer down to the bulk layer, and therefore such a problem arises that the etching is hard to control. One cause given is that the etching has the extremely high aspect. An aspect ratio represents a ratio of a film thickness of the hole to be formed to a diameter of the hole, i.e., a ratio of a depth to a diameter of a section of the hole. Further, the high aspect connotes that the depth of the hole is large as compared with the diameter of the section of the hole.

Namely, in the formation of the contact hole that is small in sectional dimension of the contact hole and has the high aspect, an etching gas does not uniformly permeate the interior of the contact hole. Therefore, a variation of etching rates within a target surface increases, and, as a result, such a problem occurs that a contact resistance is not stabilized.

Another cause lies in such a point that on the occasion of etching the contact hole, at first an oxide film is etched. This etching process proceeds uniformly to some extent. A reason why so is that the aspect ratio is still small, and the etching gas sufficiently spreads. When the contact hole reaches the aluminum oxide next, however, an etching rate decreases because of the aluminum oxide functioning as an etching stopper film.

Thereafter, the whole aluminum oxide is etched, and a silicon oxide film (which will hereinafter be simply termed an oxide film) under the aluminum oxide film is etched. This process is easier to proceed in the vicinity of the center of the wafer. Moreover, the oxygen generated from the aluminum oxide leads to an increase in etching rate of the oxide film, which further leads to occurrence of such a situation that the oxide film is extremely easy to be etched.

Figure 1:
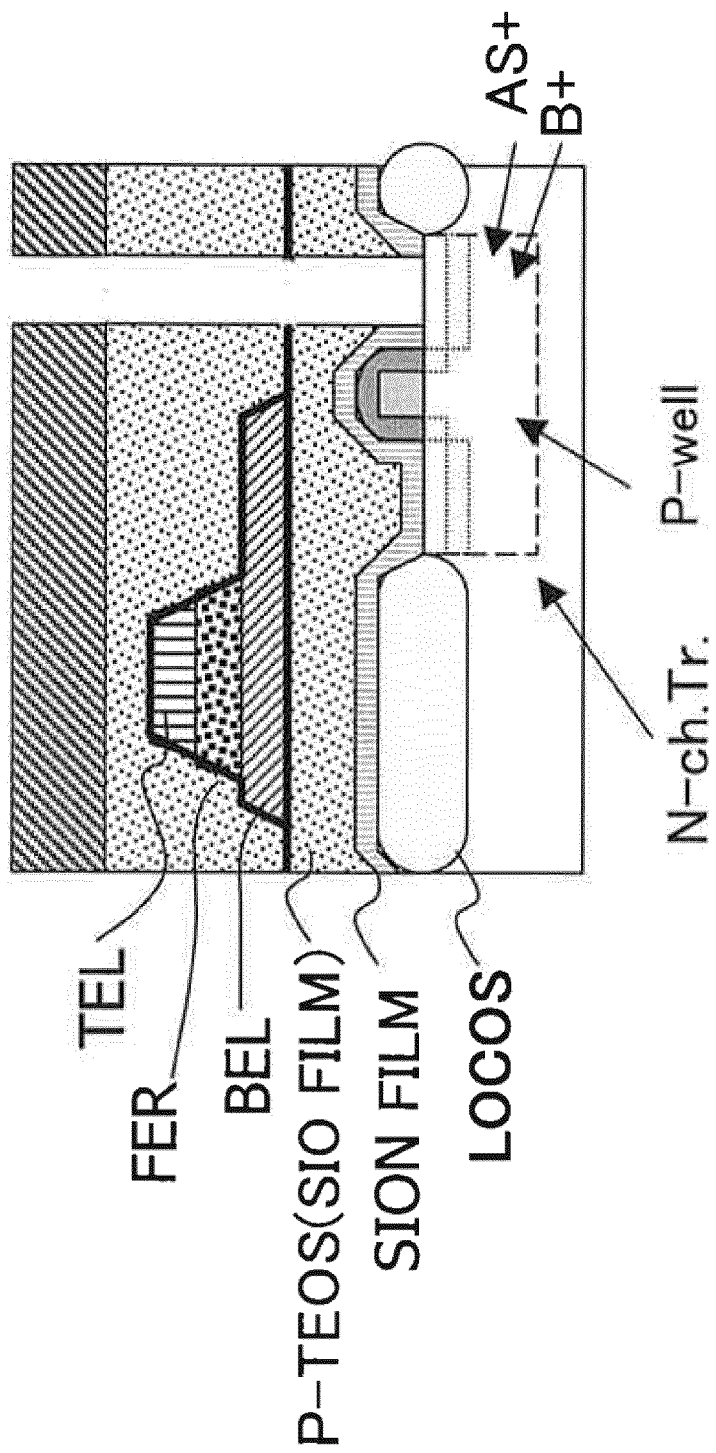
FIG. 1 is a view illustrating a problem of forming a contact hole by a conventional manufacturing method (a central portion of a wafer.
Figure 2:
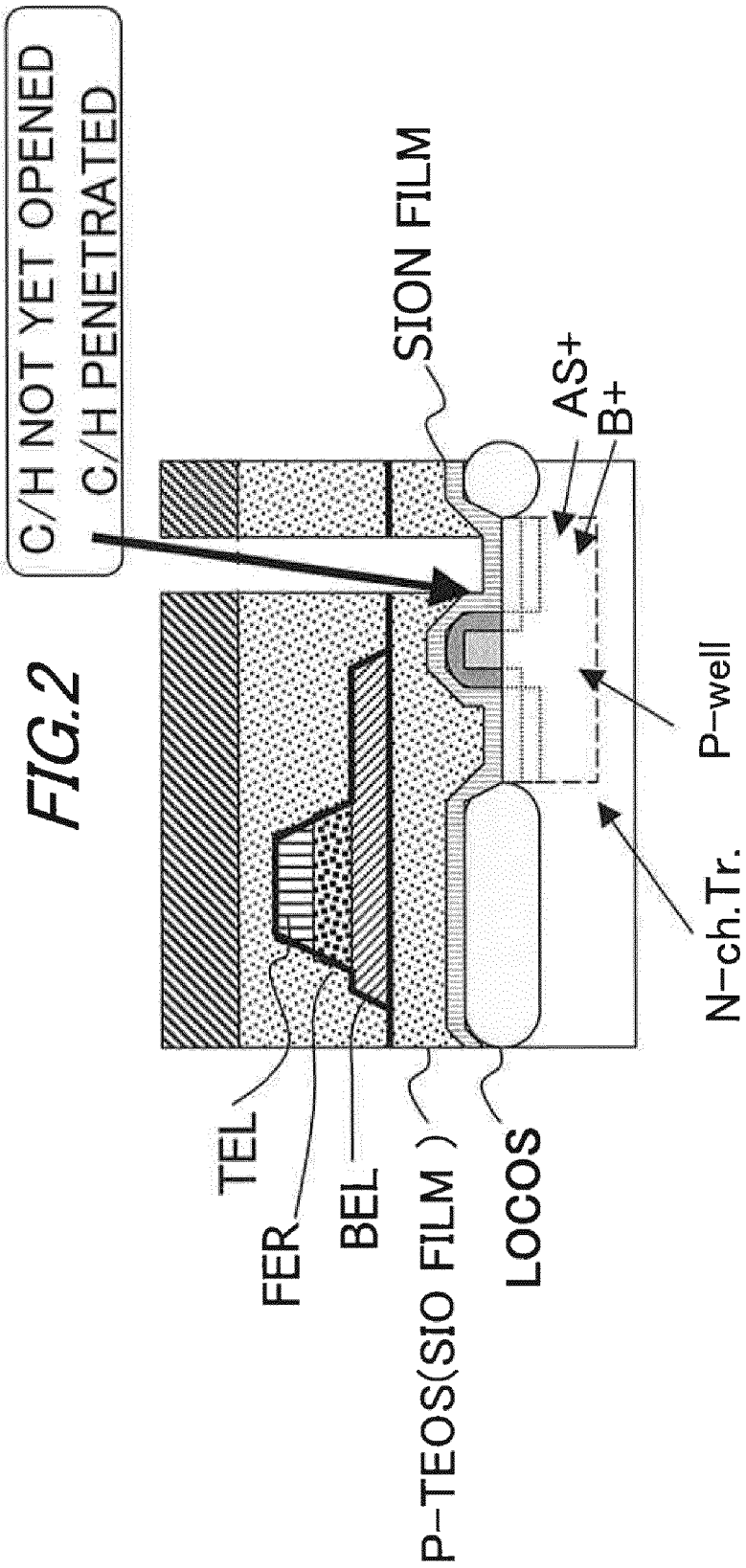
FIG. 2 is a view illustrating a problem of forming the contact hole by the conventional manufacturing method (a peripheral portion of the wafer)
Figure 3:
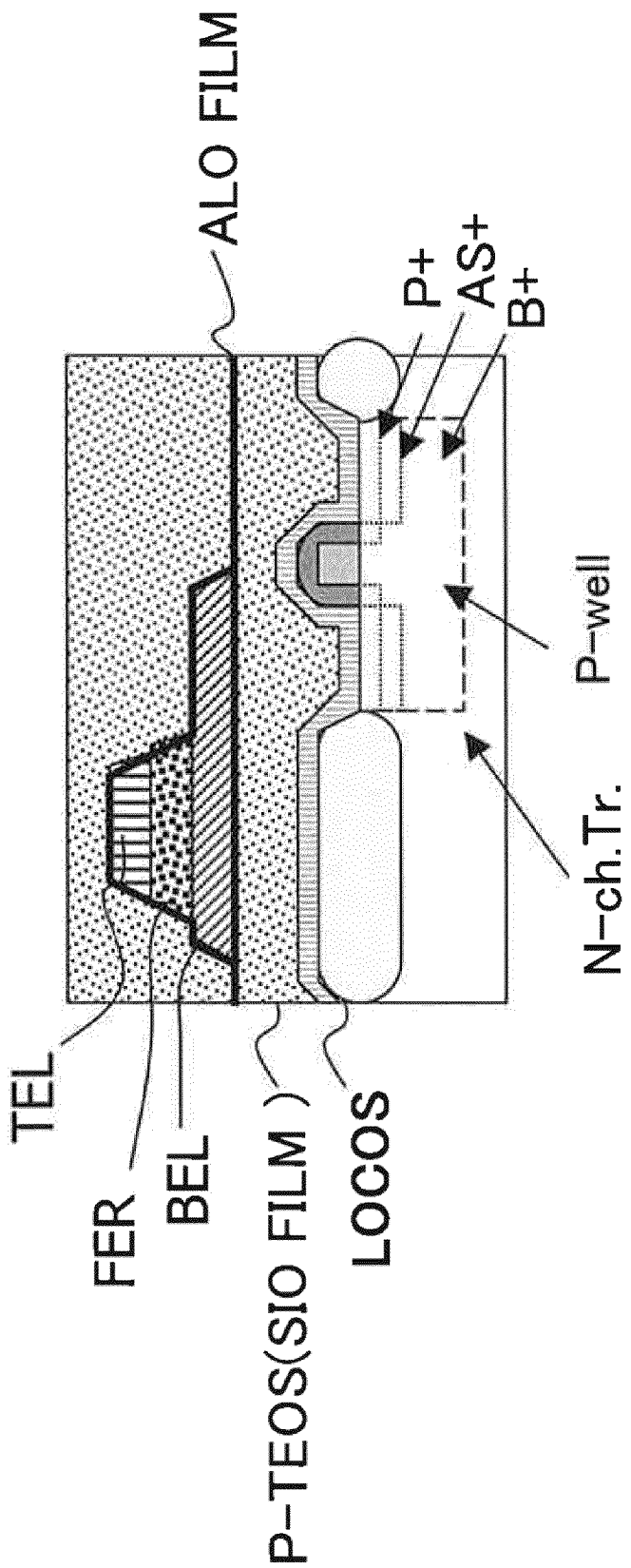
FIG. 3 is a view illustrating the conventional manufacturing method (part 1)
Figure 4:
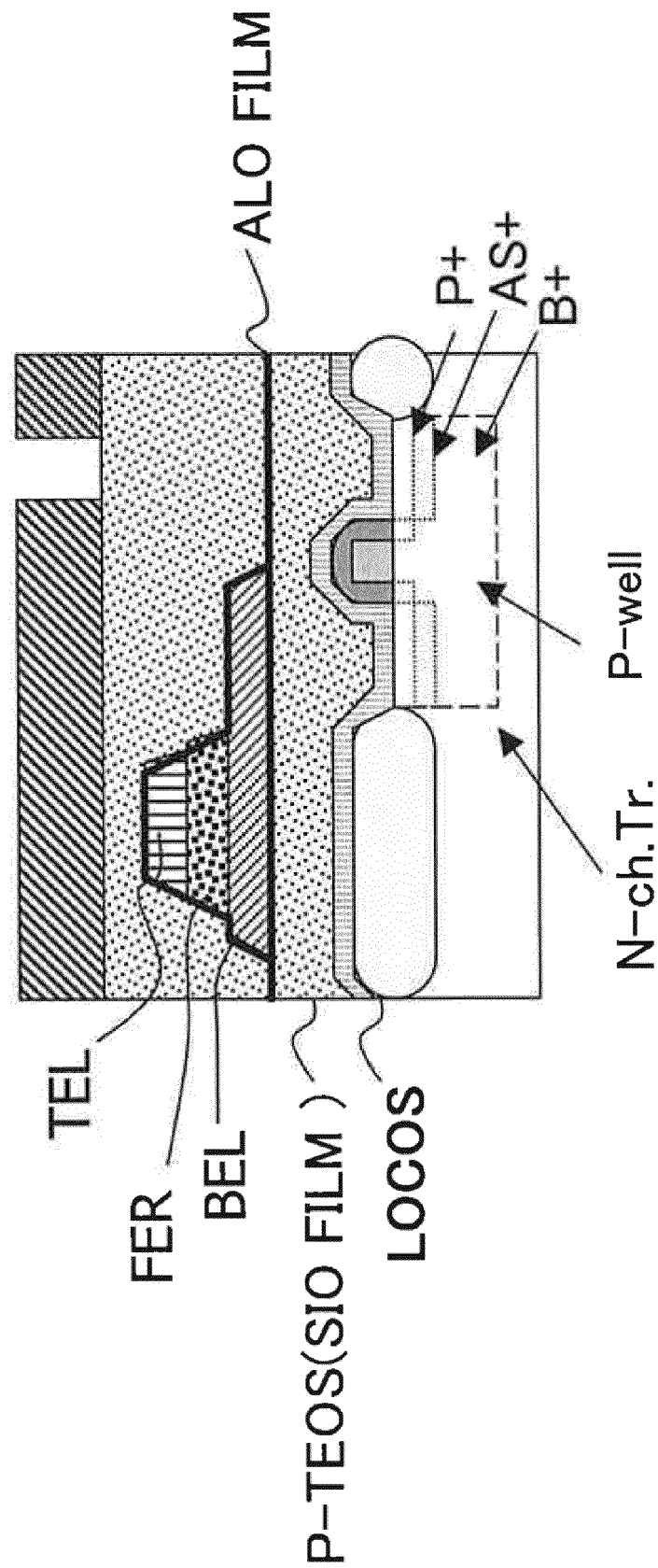
FIG. 4 is a view illustrating the conventional manufacturing method (part 2)
Figure 5:
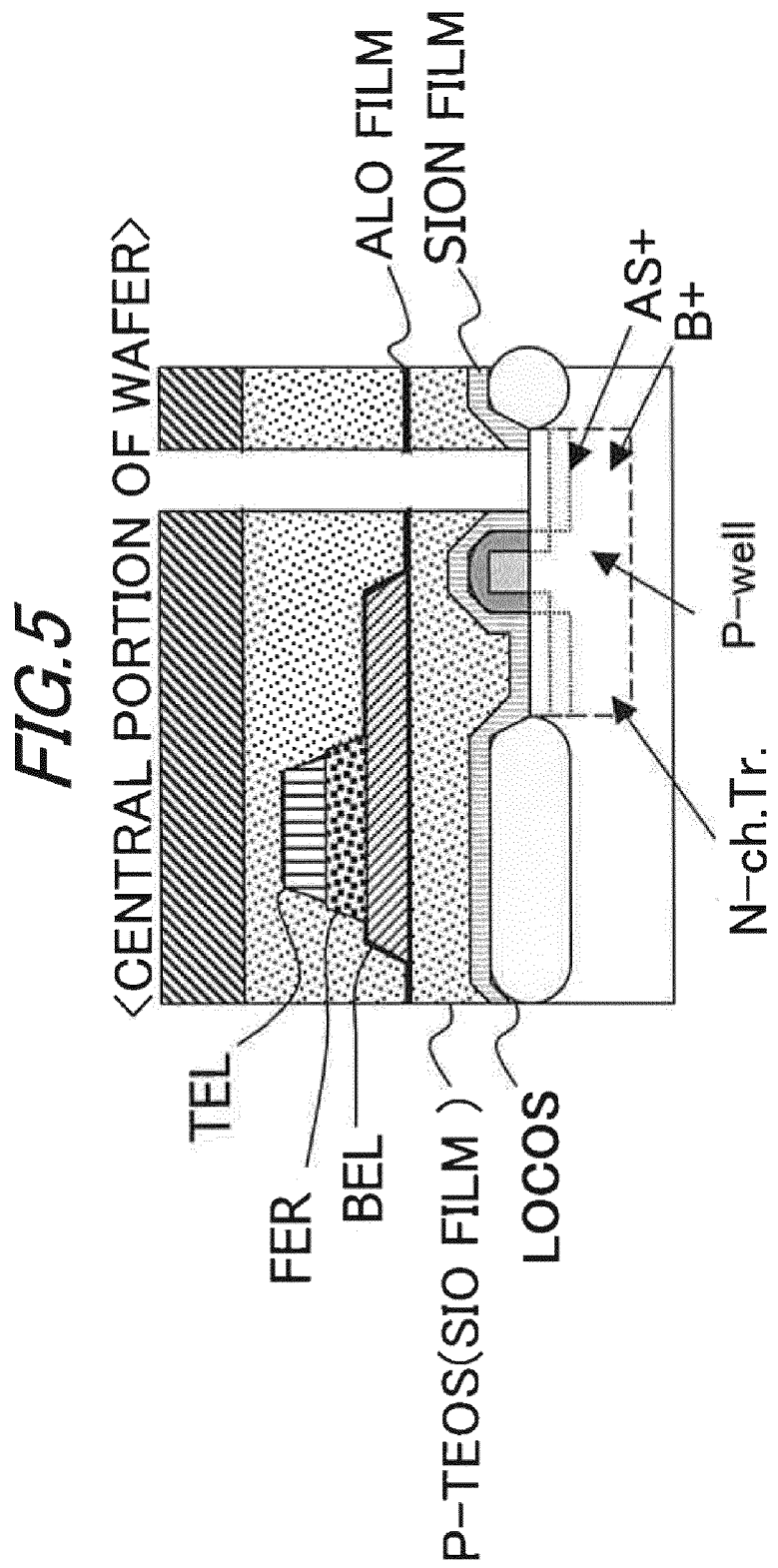
FIG. 5 is a view illustrating the conventional manufacturing method (part 3)
Figure 6:
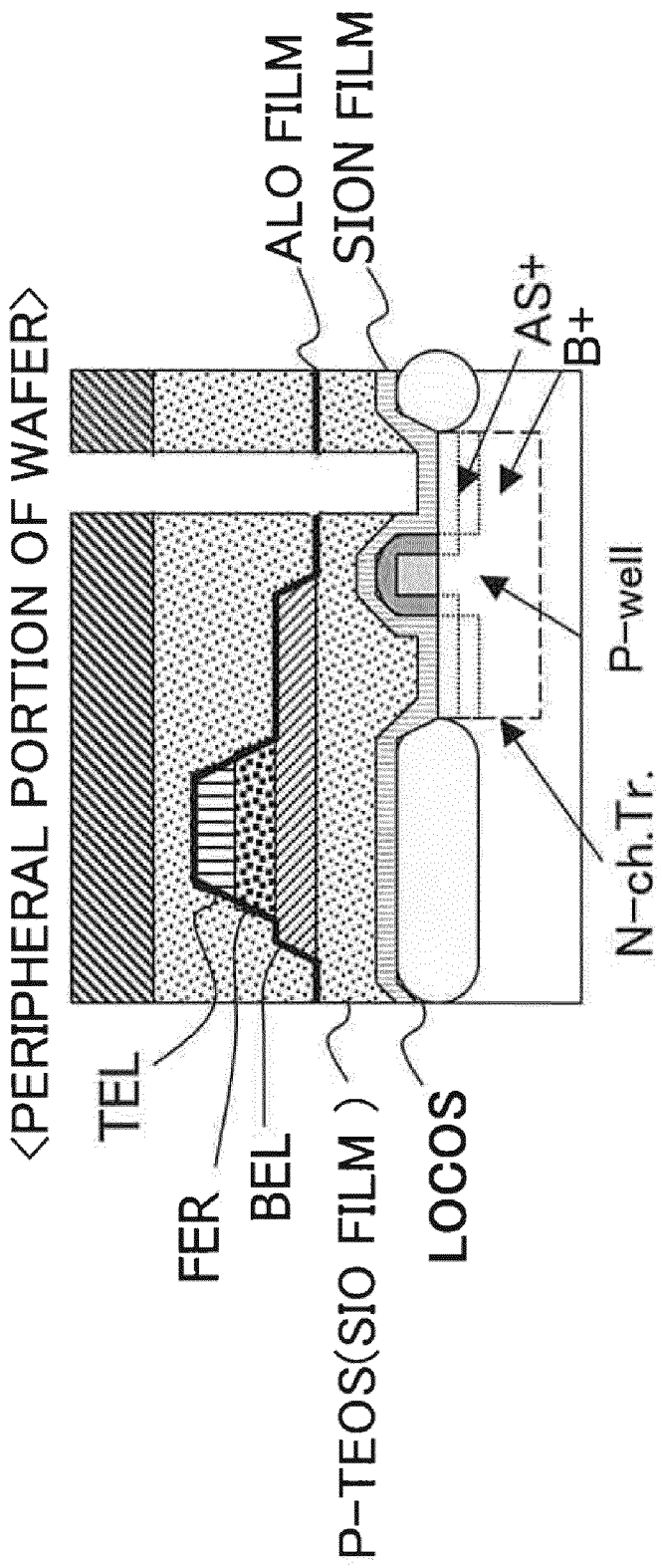
FIG. 6 is a view illustrating the conventional manufacturing method (part 4)

Therefore, a part where the aluminum oxide is etched comes to have an abrupt rise in etching rate when, thereafter, etching the oxide film. As a result, a difference in etching rate between the central portion and the peripheral portion becomes conspicuous. Namely, as in FIG. 1, even if etched under a condition enabling the contact hole having a desired depth to be formed at the central portion of the wafer, there arises a case where the depth is insufficient (not yet opened) in the peripheral portion of the wafer. Conversely, even when the etching proceeds properly as a target indicates in the peripheral portion of the wafer, penetration into a lower layer occurs in other positions on the wafer surface.

Further, thereafter, the hole formed by etching reaches a bottom portion of the contact in a transistor region. This bottom portion is, however, provided with a silicide film or a salicide film each functioning as an etching stopper film. For example, in the case of using a titan silicide film as the etching stopper film, if the aluminum oxide film does not exist in the middle of the contact hole, a selective ratio (of the oxide film to the titan silicide film) can be sufficiently taken. Whereas if the aluminum oxide film exists in the middle of the contact hole, a problem arises, in which the selective ratio decreases, and the titan silicide film is hard to function as the etching stopper film.

In order to solve these problems, an examination such as increasing the film thickness of the titan silicide film was made. A sheet resistance of the bulk contact rises due to the increase in film thickness, and a desired transistor characteristic is not obtained. Alternatively, another problem occurs, in which an electric short-circuit is caused due to influence of the titan silicide climbing up to the side of a gate.

Moreover, it is recognized that in manufacturing the ferroelectric capacitor, the inter-layer insulating film becomes extremely thick only in the peripheral portion of the wafer. Accordingly, the contact resistance can not be stably provided due to the influence of the etching and influence of a film thickness distribution of the inter-layer insulating film. A dominant factor is, however, it is assumed, derived from large influence of fluctuations of the etching rate due to the existence of the aluminum oxide film.

Such being the case, it is an aspect of the embodiment to form a contact hole having a stable shape and a stable characteristic value even when the aluminum oxide film exists in the middle of a layer formed with the contact hole.

An aspect of a semiconductor device and a manufacturing method thereof according to the embodiment will hereinafter be described. Before formation of a contact hole of a semiconductor device including a ferroelectric capacitor, a bulk layer including a transistor in a lower layer may be formed. Then, an inter-layer insulating film is formed, and the ferroelectric capacitor is formed on an upper layer thereof. Further, the inter-layer insulating film is formed, and a wiring layer is formed on an upper layer thereof. Namely, in this type of semiconductor device, the inter-layer insulating films exist on the lower and upper layers of the ferroelectric capacitor layer. Accordingly, an aspect ratio of the contact hole extending from the wiring layer to the bulk layer rises to a great degree. Consequently, in etching when forming the contact hole, a density of an etching gas, plasma, or ions, which reach a lower portion of the contact hole, easily gets uninformed.

Further, an etching rate largely changes before and after the etching of the protective layer has been completed due to existence of a protective layer ($Al_2O_3$ etc) for protecting the ferroelectric capacitor. This change results in large variations of a shape and a depth of the contact hole within a target plane of the substrate. The present manufacturing method proposes a manufacturing method of, through processes and with a configuration which are given below, reducing the variations within the target plane of the substrate and forming the contact hole having a stable shape and stable characteristics.

(1) Stepwise Control of Etching Process of Contact Hole

In the embodiment, when etching the contact hole, the etching is controlled under etching conditions that are different at respective stages such as (a) etching the inter-layer insulating film on the protective layer for protecting the ferroelectric capacitor, (b) a process of removing the protective layer for protecting the ferroelectric capacitor, and (c) etching the inter-layer insulating film under the protective layer. The variation of the etching rate when forming the contact hole and the variations of the shape and the depth of the contact hole within the target plane of the substrate are thereby reduced in a way that sets the etching conditions suited to the respective layers.

(2) Adoption of Etching Stopper Film

Together with the process (1), or alternatively in place of the process (1), an etching stopper film is formed under the protective film. The etching stopper film temporarily restrains progress of the etching. To be specific, on the occasion of individually etching an aluminum oxide film, if the etched portion is holed, the oxide film is increasingly etched, and hence an silicon oxynitride (SiON) film etc is utilized for stopping the progress of the etching by disposing the silicon oxynitride film under the aluminum oxide film.

Thereafter, such a scheme is attained as to stabilize the etching rate and reduce the variations of the shape and the depth of the contact hole within the target plane of the substrate by adopting a process of removing the etching stopper film and further etching the inter-layer insulating film under the etching stopper film.

(3) Adoption of Taper Etching

Together with the processes (1) and (2), or alternatively in place of the processes (1) and (2), taper etching is adopted. Specifically, there is increased a sectional dimension, on an upper layer side (which will hereinafter be referred to as a contact hole upper portion) of the semiconductor device, of the contact hole. On the other hand, a position in which the contact hole abuts on the bulk layer (which connotes a layer formed with the transistor etc, and corresponds to a first element layer), i.e., a dimension of a bottom surface portion of the contact hole is set to a normal dimension (a design target value).

In this case, the dimension of the contact hole bottom surface portion is smaller than the sectional dimension of the contact hole upper portion. Then, a portion (which will hereinafter be termed a contact hole lower portion) at which to connect the contact hole to the contact hole bottom surface portion is tapered in terms of its sectional dimension. Namely, the contact hole lower portion takes a tapered shape that is stepwise tapered toward the contact hole bottom surface portion.

This shape can be formed in the following procedures. (a) A sectional dimension of a resist pattern for forming the contact hole is set larger than a target dimension of the contact hole bottom surface portion. In the embodiment, a hole dimension of the resist pattern and a dimension of a contact hole opening portion are set 1.3 times through 1.5 times as large as the dimension of the bottom surface portion. (b) The contact hole upper portion is etched according to the resist pattern given in the procedure (a). The etching involves setting an anisotropic etching condition, in which the etching rate in the downward direction is set as high as possible. This contrivance leads to acquisition of the contact hole having an inner wall surface that is approximate to an inner surface of a circular cylinder and substantially parallel with a normal line of a substrate. (c) After etching the contact hole upper portion, the contact hole lower portion is etched in a way that decreases the etching rate. The decrease in the etching rate results in such a shape that the section of the shape of the tubular (columnar) inner surface is tapered in a depthwise direction with the progress of the etching.

With the contact hole given this shape, the etching gas is easy to permeate the contact hole upper portion because of the sectional dimension being relatively large. As a result, it is feasible to reduce the variation of the etching rate between a central portion of a wafer and a peripheral portion of the wafer. Then, a final shape of the contact hole bottom surface portion is set to an original target dimension, thereby satisfying a demand in terms of a layout design and a demand in terms of resistance of the contact with the element. With this contrivance, the demand in terms of the design is satisfied, and, in addition, the etching uniformity can be improved.

Further, with these characteristics, the present manufacturing method enables, even when the aluminum oxide film exists in the middle of the contact hole etching process, influence of the aluminum oxide to be decreased and the contact hole with the stability to be formed.

First Embodiment

A manufacturing method of a semiconductor device according to a first embodiment will hereinafter be discussed with reference to the drawings in FIGS. 7A-7E, FIGS. 8A-8D and FIG. 11. The first embodiment is to manufacture the semiconductor device by controlling stepwise the contact hole etching process.

<Manufacturing Process>

FIG. 11 illustrates a semiconductor device manufacturing process according to the first embodiment. Herein, to begin with, a transistor layer is formed on a semiconductor substrate (S1). The transistor layer is formed in, e.g., the following process.

To be specific, an element separation region for defining an element region is formed on the semiconductor substrate of silicon etc. Next, a well is formed by implanting an impurity within the semiconductor substrate formed with the element separation region. Then, on the semiconductor substrate formed with the well, a gate electrode is formed through a gate insulating film. Moreover, a sidewall insulating film is formed at a sidewall portion of the gate electrode. Then, source/drain diffused layers are formed on both sides of the gate electrode formed with the sidewall insulating film.

Next, the inter-layer insulating film (which will hereinafter be referred to as an inter-layer insulating film-1) is formed on the transistor layer (S2). The inter-layer insulating film-1 is formed in, e.g., the following process.

Namely, P-SiON (plasma-grown silicon oxynitride) is grown up to 200 nm in film thickness by CVD (Chemical Vapor Deposition) on the semiconductor substrate formed with the transistor. Moreover, a silicon oxide film is formed on the P-SiON film. To be specific, a P-TEOS-NSG (plasma-grown tetraethoxysilane non-doped silicate glass) film is grown up to 600 nm in film thickness by the CVD. A film growth condition is a condition that the plasma is generated with high-frequency power of 400 watts in an atmosphere which is 1400 sccm in oxygen ($O_2$) flow rate, 5 torr in pressure and 390° C. in temperature. Thereafter, the P-TEOS-NSG film is polished on the order of 200 nm in a CMP (Chemical Mechanical Polishing) process, thereby flattening the surface. Note that the P-TEOS-NSG film is also simply called a P-TEOS film or a TEOS film). Further, the P-SiON film is also simply called a SiON film.

Next, a ferroelectric capacitor layer is formed (S3). The ferroelectric capacitor layer is formed in, e.g., the following process. The ferroelectric capacitor layer corresponds to a second element layer.

Namely, another P-TEOS-NSG film is, temporarily, further grown up to 100 nm in film thickness on the previous P-TEOS-NSG film. Then, an $Al_2O_3$ film (aluminum oxide film, alumina film) is grown up to 20 nm on the TEOS film by, e.g., PVD (Physical Vapor Deposition). Subsequently, a Pt film is grown as a lower electrode up to 155 nm in film thickness by, e.g., the PVD on the $Al_2O_3$ film.

On the thus-formed Pt film, a PZT (lead zirconate titanate) film is grown up to 150-200 nm in film thickness by, e.g., the PVD. After forming the PZT film, an annealing process based on, e.g., RTA (Rapid Thermal Annealing) is executed.

Next, an $IrO_2$ (iridium oxide) film is grown as an upper electrode up to 50 nm in film thickness by, e.g., the PVD on the PZT film. After forming the $IrO_2$ film, the annealing process based on, e.g., the RTA is carried out. Subsequently, another $IrO_2$ film is again grown up to 200 nm in film thickness by, e.g., the PVD on the previous $IrO_2$ film. Then, in order to form a pattern 1 of the upper electrode, a pattern based on a photo resist is formed, and the $IrO_2$ film is etched. Then, a recovery anneal of the PZT film involves executing a thermal treatment in, e.g., a vertical furnace.

Subsequently, for forming a pattern of the ferroelectric capacitor, the photo resist is formed, and the PZT film is etched. Moreover, for the recovery anneal of the PZT film, the thermal treatment is conducted in, e.g., the vertical furnace. Further, the $Al_2O_3$ film is formed by, e.g., the PVD over the entire surface of the wafer for protecting the PZT film. After forming the $Al_2O_3$ film, the thermal treatment is carried out in, e.g., the vertical furnace.

Furthermore, formation of a pattern of the lower electrode involves forming the pattern based on the photo resist and etching the Pt film. Next, for the recovery anneal of the PZT film, the thermal treatment is performed in, e.g., the vertical furnace.

Next, the protective layer for protecting the ferroelectric capacitor is formed (S4). The $Al_2O_3$ film serving as the protective layer is formed by, e.g., the PVD over the whole surface of the wafer. Note that the film thickness of the $Al_2O_3$ film is equal to or larger than 20 nanometers (nm) but less than 100 nanometers (nm) in the first embodiment. After forming the $Al_2O_3$ film, the thermal treatment is executed in, e.g., the vertical furnace.

Moreover, an inter-layer insulating film-2 is formed on the protective layer (S5). For example, the P-TEOS-NSG (plasma-grown tetraethoxysilane non-doped silicate glass) film is grown up to 1500 nm in film thickness by, e.g., the CVD so as to completely cover the ferroelectric capacitor. After forming the P-TEOS-NSG film, the surface is flattened by the CMP process.

Next, the resist pattern for the contact hole is formed (S6). The resist pattern is formed by coating the photo resist and by photolithography using a reticle. At this time, a dimension of the contact hole pattern on the reticle is set larger by a predetermined value than the contact hole pattern determined by the original design. In the first embodiment, the dimension (corresponding to a first sectional dimension) of the contact hole pattern is approximately 1.3 through 1.5 times as large as the dimension of the original design. Accordingly, the resist pattern based on the photolithography is formed larger by the predetermined value than the original (design) dimension.

Next, the inter-layer insulating film-2 is etched in a first etching process (first etching step) (S7) The first etching process is a process of the etching just anterior to the protective layer. An etching condition is given as below. The etching gas is composed of a $C_4F_8$ gas that is 20 ml/min, an Ar gas that is 500 ml/min and an $O_2$ gas that is 12 ml/min, and a gas pressure is 6.6 Pa. Further, the high-frequency input power is on the order of 2000 watts to the upper electrode of the etching apparatus and 900 watts to the lower electrode of the etching apparatus.

Herein, the high-frequency input power to the lower electrode of the etching apparatus generates a bias potential toward the wafer, which acts on the plasma. Herein, the lower electrode represents an electrode of the etching apparatus on the earth side. The high-frequency power to the lower electrode of the etching apparatus affects the bias potential generated between the substrate disposed on the earth side and the plasma.

The lower electrode of the etching apparatus is set at the 900 watts, whereby the bias potential acts on the ions in the plasma, while the ions are, it follows, accelerated toward the wafer. With the bias potential in the case of setting the lower electrode at the 900 watts, however, the acceleration of the plasma is not intensified to such a degree as to etch the protective layer (AlO film) Accordingly, it follows that the first etching process under this condition stops at the protective layer.

Next, the protective layer ($Al_2O_3$) is etched in a second etching process (second etching step) (S8). The etching condition is given as follows. The $C_4F_8$ gas is on the order of 20 ml/min, the Ar gas is 500 ml/min, the $O_2$ gas that is 12 ml/min, and the gas pressure is 6.6 Pa. Moreover, the high-frequency input power is on the order of 2000 watts to the upper electrode of the etching apparatus and 2000 watts to the lower electrode of the etching apparatus.

The high-frequency power of 2000 watts is inputted to the lower electrode of the etching apparatus, whereby a sufficiently strong bias potential acts on the plasma, and the ions in the plasma are, it follows, struck against the protective layer. As a result, the protective layer is etched. Termination of etching the protective layer can be controlled based on, e.g., a period of etching time. The necessary etching time can be set according to an experimental value (empirical value) obtained by changing a film thickness of the protective layer, a film type of the protective layer, an etching gas ratio, an in-chamber gas pressure, the high-frequency power to the upper electrode, the high-frequency power to the lower electrode, a temperature of a stage on which the wafer is placed, and a temperature of a sidewall of the chamber.

Next, the TEOS film constituting an upper layer of the inter-layer insulating film-1 is etched in a third etching process (third etching step) (S9). The etching condition is given as below. The etching gas is composed of the $C_4F_8$ gas that is 20 ml/min, the Ar gas that is 500 ml/min and the $O_2$ gas that is 12 ml/min, and the gas pressure is 6.6 Pa. Further, the high-frequency input power is on the order of 2000 watts to the upper electrode of the etching apparatus and 500 watts to the lower electrode of the etching apparatus. Under this condition, in the same way as the first etching process, it follows that the inter-layer insulating film-1 is etched.

The high-frequency input power to the lower electrode is, however, on the order of 500 watts, and therefore the bias potential applied to the plasma becomes weaker than under the normal SiO film etching condition. Accordingly, an energy for accelerating the ions in the plasma toward the wafer decreases. Moreover, a density of the plasma generated by the high-frequency power of 2000 watts to the upper electrode becomes high for a comparatively-high-density gas existing at 6.6 Pa. Hence, the ions in the plasma have a high probability of colliding with neutral molecules or atoms and mean free paths of the ions are short as compared with the case of the plasma based on a low-density gas. As a result, a ratio of the ions migrating toward the wafer decreases, and the etching directivity of the plasma gets more diffused than in the first etching process. Consequently, the number of ions incident vertically upon the wafer decreases, and an etching effect of the plasma incident via the opening portion of the resist pattern becomes stronger as it gets closer to the center of the opening portion but weaker as it gets closer to the periphery thereof. Accordingly, the hole formed in this process takes the tapered shape that tapers off. It is noted, the high-frequency input power to the lower electrode (500 watts in the embodiment) in the third etching process may be understood to be controlled to approximately ⅔ or less of the power to the lower electrode (900 watts in the embodiment) in the first etching process which may be understood to be a case of executing an anisotropic etching process.

Accordingly, the etching condition in the third etching process and a taper angle of the hole are experimentally measured, whereby the dimension of the bottom surface portion of the hole formed in the third etching process can be predicted. Conversely, the dimension of the bottom surface portion of the hole can be controlled based on the film thickness of the inter-layer insulating film-1 and the taper angle determined by etching condition.

Further, the gas for generating the plasma is a mixed gas of the $C_4F_8$ gas, the Ar gas and the $O_2$ gas, in which case this mixed gas is not suitable for etching the SiON film. It therefore follows that the third etching process stops at the SiON film.

Next, the SiON film constituting the lower layer of the inter-layer insulating film-1 is etched in a fourth etching process (fourth etching step) (S10). The etching condition is given as below. The etching gas is composed of the $C_4F_8$ gas that is 20 ml/min, a $CF_4$ gas that is 10 ml/min, the Ar gas that is 500 ml/min and the $O_2$ gas that is 11 ml/min, and the gas pressure is 6.6 Pa. Further, the high-frequency input power is on the order of 2000 watts to the upper electrode of the etching apparatus and 900 watts to the lower electrode. In this case, the SiON film defined as the nitride film is etched in terms of a chemical property of the $CF_4$ gas. In the fourth etching process also, in the same way as in the second etching process, the etching rate is determined from the experimental value (empirical value) in accordance with the gas ratio, the gas pressure and the high-frequency power. Then, the etching time is set to a predetermined period of time according to the etching rate.

Note that if the high-frequency input power to the lower electrode is set to 900 watts, similarly to the first etching process in S1, the substrate surface is anisotropically etched substantially in the vertical direction.

Working Example

Figure 7A:
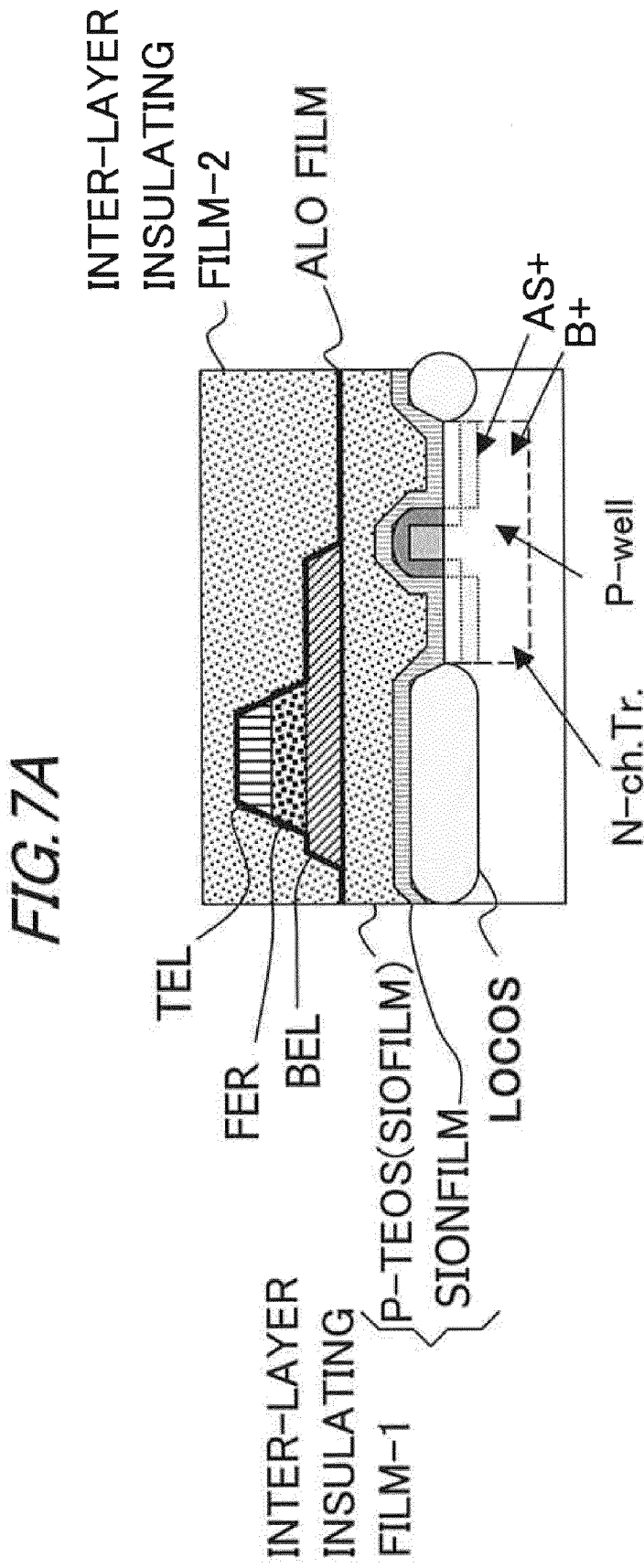
FIG. 7A is a view illustrating a sectional view of a semiconductor device with completion of a process up to an inter-layer insulating film-2.

A working example of the manufacturing process of the semiconductor device according to the first embodiment is illustrated with reference to FIGS. 7A-7E. FIG. 7A depicts a sectional view of the semiconductor device with completion of the processes up to the inter-layer insulating film-2. In FIG. 7A, an n-type transistor is formed in a region sectioned by LOCOS. P-type impurities arsenic (As) and boron (B) are implanted into a source region and a drain region of the n-type transistor. Moreover, the SiON film (the oxynitride film of silicon) and the P-TEOS film on this SiON film are formed generically as the inter-layer insulating film-1 on the transistor layer including the n-type transistor.

Further formed is the ferroelectric capacitor layer of which upper and lower layers are covered with the protective films (also called the aluminum oxide films, which will hereinafter be also referred to as the AlO films). The ferroelectric capacitor includes the lower electrode (BEL: Bottom ELectrode), a ferroelectric film (FER) and the upper electrode (TEL: Top ELectrode). Moreover, the P-TEOS film (SiO film) is formed as the inter-layer insulating film-2 on the ferroelectric capacitor layer and the protective film.

Figure 7B:
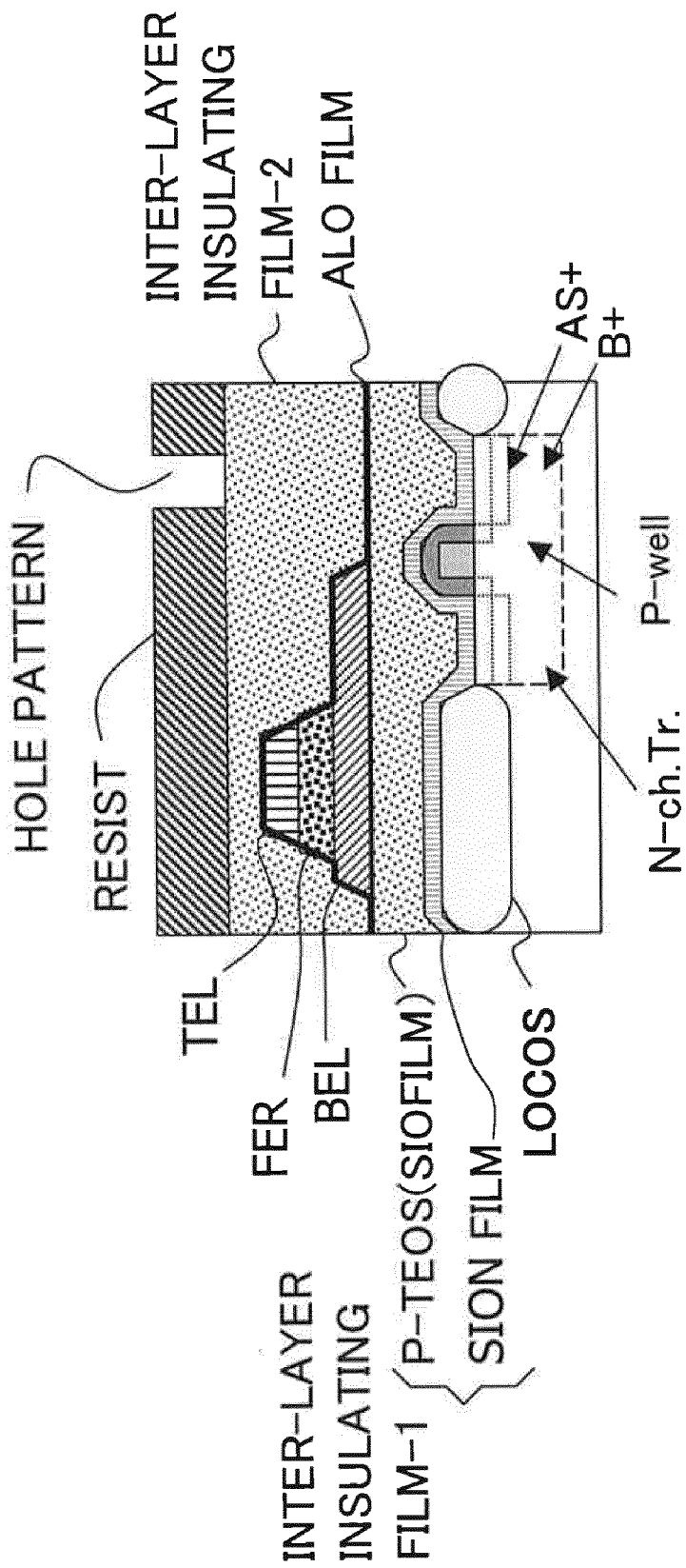
FIG. 7B is a view illustrating how a resist pattern is formed.
Figure 7C:
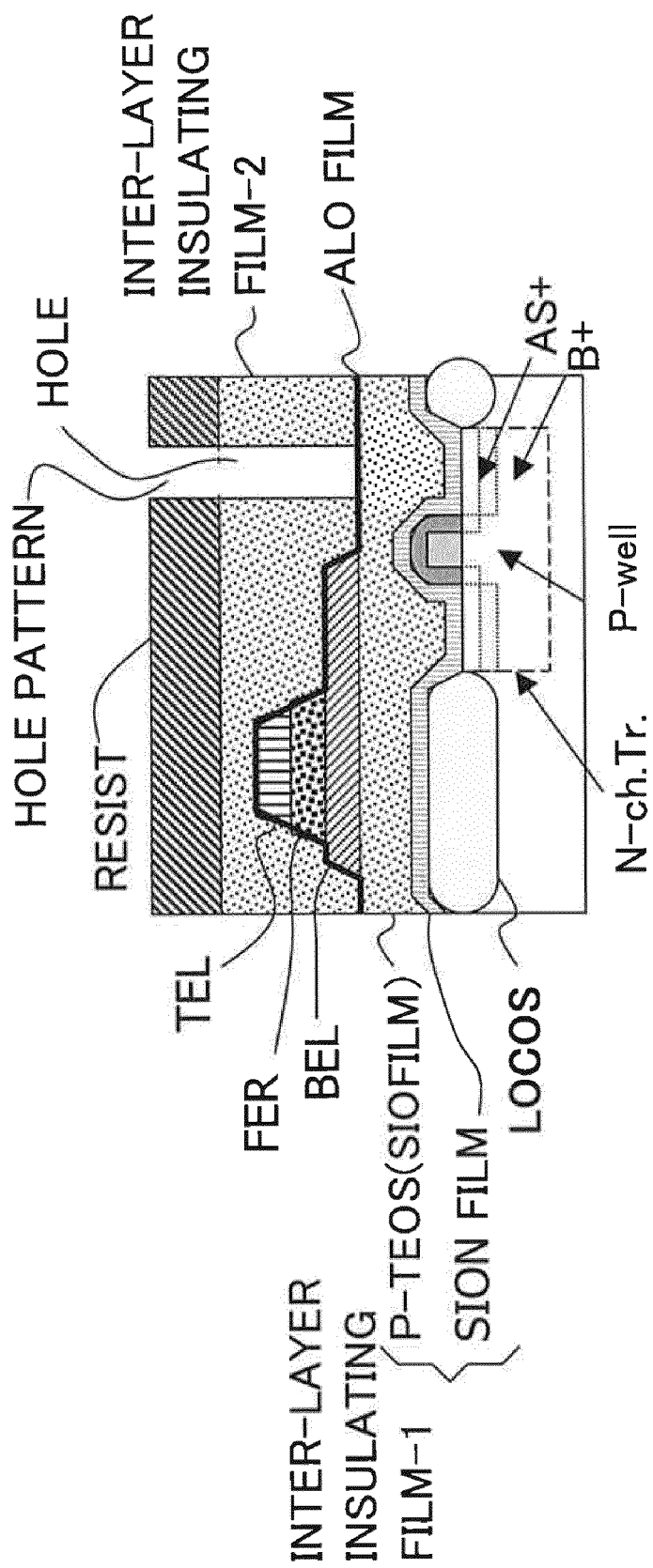
FIG. 7C is a view illustrating how the inter-layer insulating film-2 is etched.
Figure 7E:
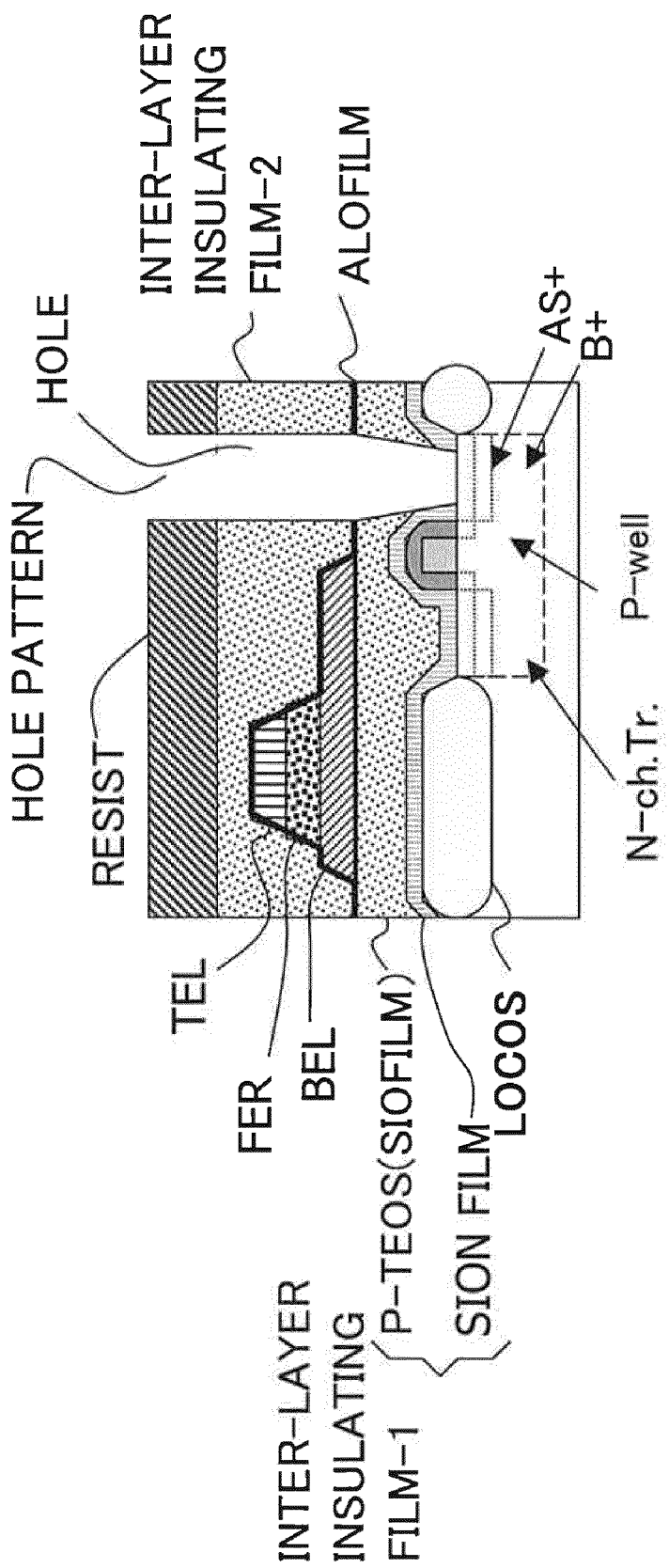
FIG. 7E is a view illustrating how a SiON film under the hole is etched.

Next, the resist is coated over the inter-layer insulating film-2, thus forming the resist pattern in the photolithography process (FIG. 7B). A dimension of the hole of the resist pattern is set larger than a target value. Then, with the resist serving as a mask, the inter-layer insulating film-2 is etched (FIG. 7C). Herein, the substrate is holed substantially in the vertical direction by the anisotropic etching. Next, the protective film (AlO film) is removed by etching (FIG. 7D). Furthermore, the inter-layer insulating film-2 is taper-etched, thereby extending the hole down to the SiON film (FIG. 7E).

Figure 8B:
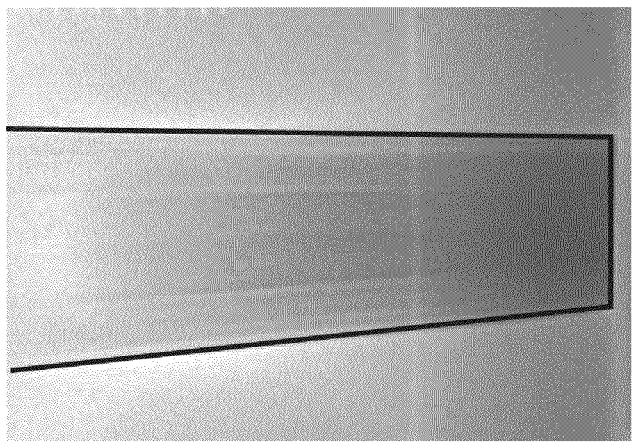
FIG. 8B is a view illustrating a sectional shape (SEM photo) of the hole based on taper-etching in the case of setting high-frequency input power of a lower electrode at 600 watts.
Figure 8A:
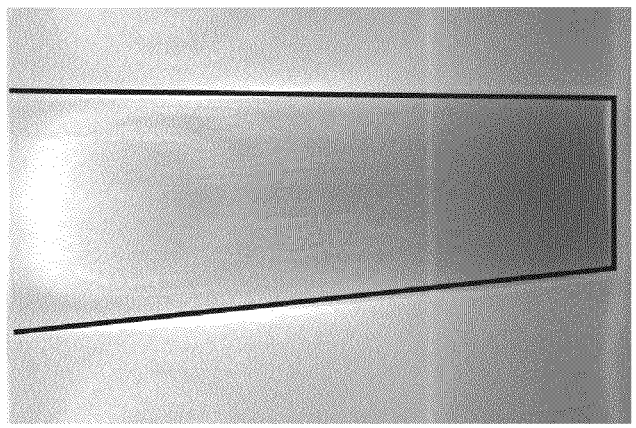
FIG. 8A is a view illustrating a sectional shape (SEM (Scanning Electron Microscope) photo) of the hole based on conventional anisotropic etching.

FIG. 8A depicts a sectional shape (SEM (Scanning Electron Microscope) photo) of the hole formed by the conventional anisotropic etching. The etching condition at this time is given as below. The etching gas is composed of the $C_4F_8$ gas that is 20 ml/min, the Ar gas that is 500 ml/min and the $O_2$ gas that is 12 ml/min, and the gas pressure is 6.6 Pa. Further, the high-frequency input power is on the order of 2000 watts to the upper electrode of the etching apparatus and 900 watts to the lower electrode. FIG. 8B depicts a sectional shape (SEM photo) of the hole formed by taper-etching when the high-frequency input power to the lower electrode is set to 600 watts.

Figure 8D:
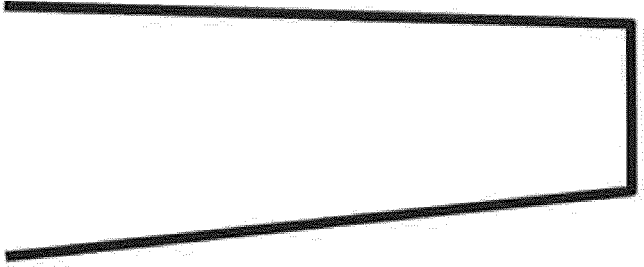
FIG. 8D is a view illustrating a contour of a tapered portion in FIG. 8B.
Figure 8C:
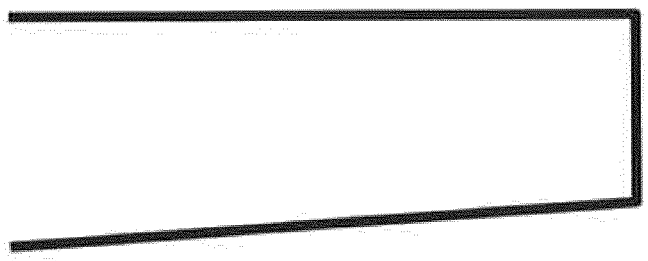
FIG. 8C is a view illustrating a contour of a tapered portion in FIG. 8A.

FIGS. 8C and 8D respectively illustrate contours of the tapered portions obtained from the sectional photos. Note that when the high-frequency input power to the lower electrode is set to 500 watts, the taper angle can be further largely inclined.

Actual values of the hole dimensions acquired in the first embodiment are given as follows.

TABLE 1

Case of Vertical Type of Conventional Contact Hole (nm)

| TOP Diameter | Bottom Diameter | Working Example |
|---|---|---|
| 500 | 500 | 650 |
| 400 | 400 | 520 |
| 300 | 300 | 390 |
| 200 | 200 | 260 |

TABLE 2

Case of Taper Type (nm)

| TOP Diameter | Bottom Diameter | Working Example |
|---|---|---|
| 500 | 450 | 585 |
| 400 | 360 | 468 |
| 300 | 270 | 351 |
| 200 | 180 | 234 |

Herein, the TOP diameter connotes a diameter (target value) of the opening portion of the contact hole, and the Bottom diameter represents a diameter (target value) of the bottom surface portion of the contact hole. Further, the [Working Example] indicates the diameter of the opening portion of the contact hole in the case of the first embodiment, and the bottom surface portion of the contact hole in this case is controlled by the Bottom diameter. In this instance, the film thickness of the inter-layer insulating film-1 is 600 nm (SiON film 200 nm+TEOS film 400 nm).

As in Table 1, for example, the Bottom diameter is 500 nm, while the TOP diameter of the opening portion is 650 nm. A ratio thereof is approximately 1:1.3. Further, in the case of Table 2, for example, the Bottom diameter is 450 nm, while the TOP diameter of the opening portion is 585 nm. The ratio thereof is approximately 1:1.3. Thus, after the opening portion has been set to the dimension that is 1.3 times or above as large as the original target value, the bottom surface portion of the hole could be adjusted down to the design dimension by taper-etching.

Moreover, the SiON film under the hole is etched in a way that changes the etching condition. The hole is thereby extended to the transistor layer (FIG. 7E). In this case, for instance, an untapered hole, of which an internal surface takes a vertically cylindrical shape, is extended under the etching condition given in S10 of FIG. 11.

As discussed above, even in the case of the contact hole having the high aspect ratio, a sufficient amount of etching gas can be supplied into the contact hole. Further, on the occasion of etching the contact hole, even when the aluminum oxide film exists in the middle of the hole, the layers anterior and posterior to the aluminum oxide film are etched in a way that divides the stage, and the etching conditions are individually controlled, thereby enabling the etching control to be sufficiently conducted. As a result, the contact hole can be formed stably with a low resistance value of the contact resistance over the entire surface of the wafer. Accordingly, long-term reliability of the semiconductor device is improved.

Further, a supply quantity of the oxygen supplied from the aluminum oxide decreases, and therefore the etching control can be sufficiently attained with the etch stopper film for the transistor layer.

First Modified Example

In the first embodiment discussed above, the TEOS film is taper-etched in the third etching process, and the SiON film undergoes the normal anisotropic etching in the fourth etching process. In addition to the third etching process, however, the taper-etching may also be executed in the fourth etching process. A condition for the taper-etching in the fourth etching process may be set such that the high-frequency power to the lower electrode is set at 500 watts in, e.g., the fourth etching process in S10 of FIG. 11. Thus, the bias potential applied to the plasma is weakly controlled by decreasing the high-frequency power to the lower electrode. As a result, the hole to be formed takes, similarly to the third etching process, the tapered shape that tapers off. In this case, the bottom surface of the hole can be adjusted down to the design dimension by controlling the taper angle with respect to the thickness into which the thickness of the TEOS film is combined with the thickness of the SiON film.

Second Modified Example

In the first embodiment discussed above, the taper-etching is carried out in the third etching process, however, if the taper-etching is not executed, the same etching condition as in the first etching process may be set. In this case, the anisotropic etching is performed in both of the third etching process and the fourth etching process. In this instance, the sectional dimension of the hole of the resist pattern is set according as the design value specifies. It is therefore hard to obtain such an effect in the first embodiment that the etching gas uniformly permeates the upper portion of the hole. The etching is, however, conducted by controlling the etching conditions in separation into the four stages of the first etching process through the fourth etching process, whereby the variation of the working shape and the variation of the working depth of the hole can be reduced.

Third Modified Example

In the working example given above, the inter-layer insulating film-1 includes the two layers such as the SiON film and the P-TEOS film. Then, the TEOS film is etched in the third etching process, and the SiON film is etched in the fourth etching process. In place of these processes, however, any inconvenience may not be caused by etching the P-TEOS film and the SiON film in one etching process under the same etching condition.

The etching condition in this case is given as below. For example, the etching gas is composed of the $C_4F_8$ gas that is 20 ml/min, the $CF_4$ gas that is 10 ml/min, the Ar gas that is 500 ml/min and the $O_2$ gas that is 11 ml/min, and the gas pressure is 6.6 Pa. Further, the high-frequency input power is on the order of 2000 watts to the upper electrode of the etching apparatus and 500 watts to the lower electrode. This condition is the same as the condition for taper-etching the SiON film. To be specific, the TEOS film can be etched at the gas ratio for etching the SiON film. Moreover, the high-frequency power to the lower electrode is set at 500 watts, thereby enabling the P-TEOS film and the SiON film to be taper-etched.

On the other hand, the high-frequency power to the lower electrode is set at 900 watts, whereby the P-TEOS film and the SiON film can be etched (can be subjected to the normal anisotropic etching) in the downward direction parallel with the normal line of the substrate.

Fourth Modified Example

FIG. 12 illustrates a manufacturing process of the semiconductor substrate according to a fourth modified example of the first embodiment. In this fourth modified example, the protective film (aluminum oxide film) removing process is different from the case in FIG. 11. Specifically, in the first embodiment, the oxide film in the contact hole is removed by etching. An available substitute for utilizing the etching apparatus is, however, that an inactive gas such as argon is introduced into a PVD apparatus and the protective film is removed in a high-frequency process (S8A).

A process condition of the PVD apparatus in this case is that the Ar gas is 25 sccm, the pressure is 0.5 mTorr, the high-frequency input power to the upper electrode of the PVD apparatus is 2000 watts, and the high-frequency input power to the lower electrode is 500 watts. In the PVD apparatus with this condition being thus set, the argon ions are generated by a high frequency and made to collide with the protective film in the hole, thereby physically cutting off the protective film.

A target value of a polishing quantity in this case is set 1.0 through 1.5 times as large as the film thickness of the removing target film. Namely, it is desirable that the PVD apparatus be controlled under such a condition as to remove the removing target film in excess of about 50%.

Other processes in the manufacturing process according to the fourth modified example are almost the same as those in FIG. 11. This being the case, the same processes are marked with the same numerals and symbols as those in FIG. 11, and their explanations are omitted.

Fifth Modified Example

Figure 13:
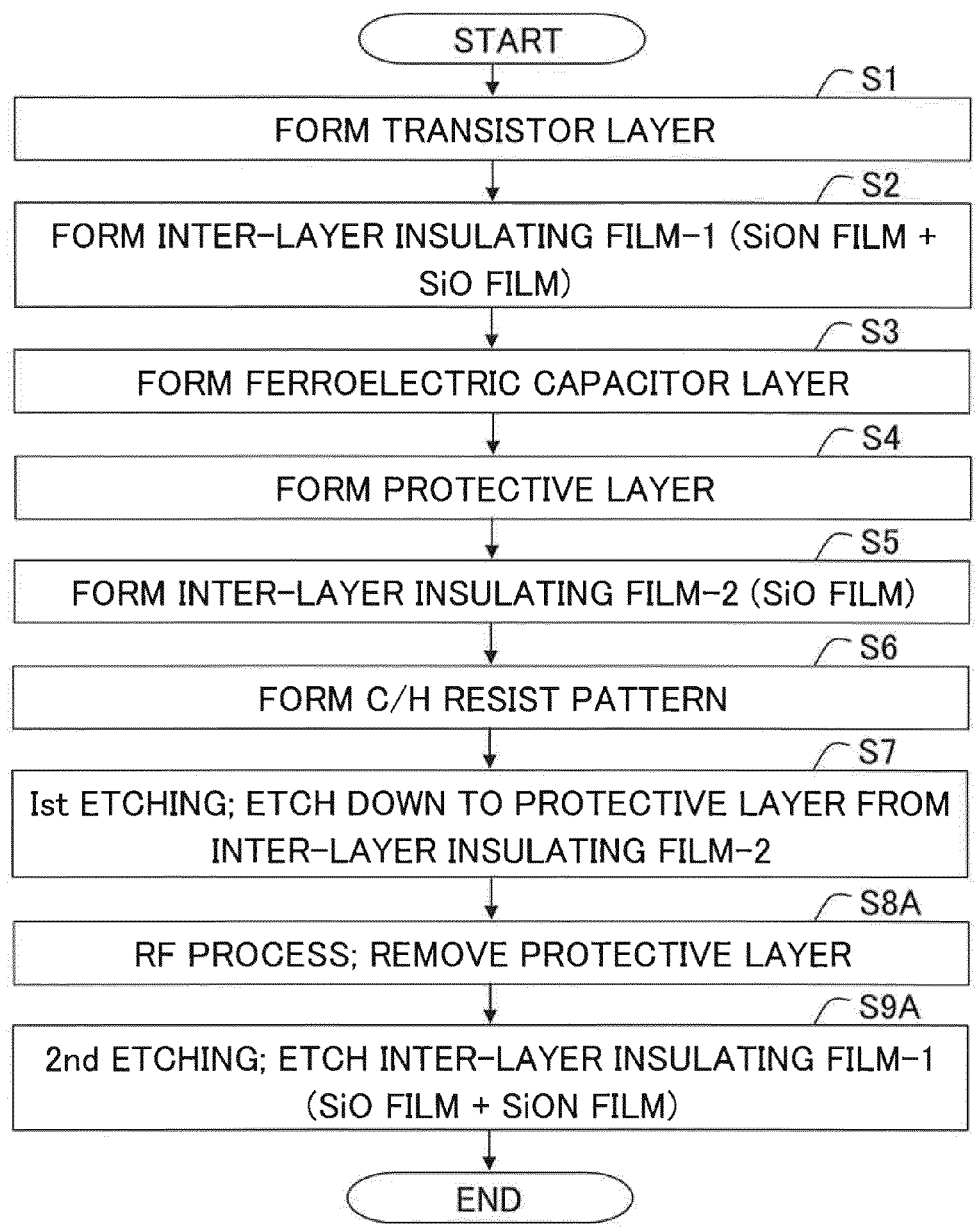
FIG. 13 is a flowchart illustrating a manufacturing process of the semiconductor device according to a fifth modified example of the first embodiment.

FIG. 13 illustrates a manufacturing process of the semiconductor substrate according to a fifth modified example of the first embodiment. In this fifth modified example, the protective film (aluminum oxide film) removing process is different from the case in FIG. 11. Further, as compared with the case in FIG. 12, the inter-layer insulating film-1 is etched in one etching process (S9A). The etching condition in this case is, e.g., if taper-etched, such that the etching gas is composed of the $C_4F_8$ gas that is 20 ml/min, the $CF_4$ gas that is 10 ml/min, the Ar gas that is 500 ml/min and the $O_2$ gas that is 11 ml/min, and the gas pressure is 6.6 Pa. Further, the high-frequency input power is on the order of 2000 watts to the upper electrode of the etching apparatus and 500 watts to the lower electrode.

It is noted, if not taper-etched in the process for the inter-layer insulating film-1 in S9A, it may be sufficient that the high-frequency power to the lower electrode is set at 900 watts.

Second Embodiment

A manufacturing method of the semiconductor device according to a second embodiment will hereinafter be described with reference to the drawings in FIGS. 9A-9F and FIG. 14. In the second embodiment, as compared with the case of the first embodiment, an etching stopper film is formed under the ferroelectric capacitor layer. Other configurations and operations are the same as those in the case of the first embodiment. This being the case, the same processes and the same components as those in the first embodiment are marked with the same numerals and symbols, and their descriptions are omitted.

<Manufacturing Process>

Figure 14:
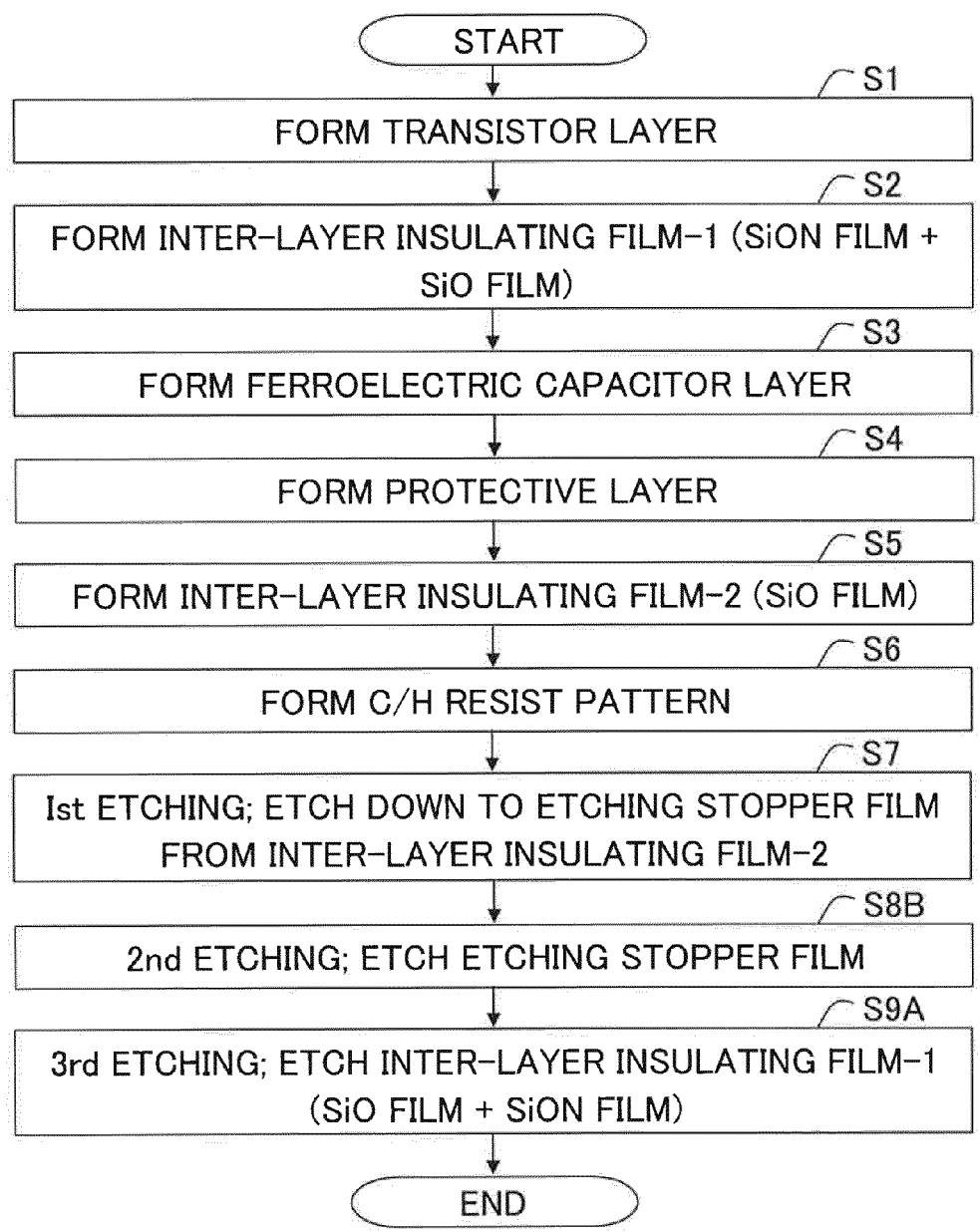
FIG. 14 is a flowchart illustrating a manufacturing process of the semiconductor device according to a second embodiment.

FIG. 14 depicts a manufacturing process of the semiconductor device according to the second embodiment.

Herein, after forming the inter-layer insulating film-1, the etching stopper film is formed (S2A). The etching stopper film is, e.g., the SiON film.

The film growth condition thereof is the same as the condition of the SiON film constituting the inter-layer insulating film-1 (refer to the description of S2 in FIG. 11). Further, in the second embodiment, a film thickness of the etching stopper film is on the order of 30 nanometers through 150 nanometers.

Moreover, the processes in S3-S7 are the same as those in FIG. 11, and hence their explanations are omitted. After completion of etching down to the inter-layer insulating film-2 (S7), the etching stopper film is etched (S8B). The etching condition thereof is the same as the condition (the condition in S10 of FIG. 11) of the fourth etching process in the first embodiment.

Next, the inter-layer insulating film-1 is taper-etched (S9C). The etching condition thereof is the same as in the case of S9A of FIG. 13, in which the high-frequency input power to the lower electrode is set at 500 watts.

Working Example

Figure 9A:
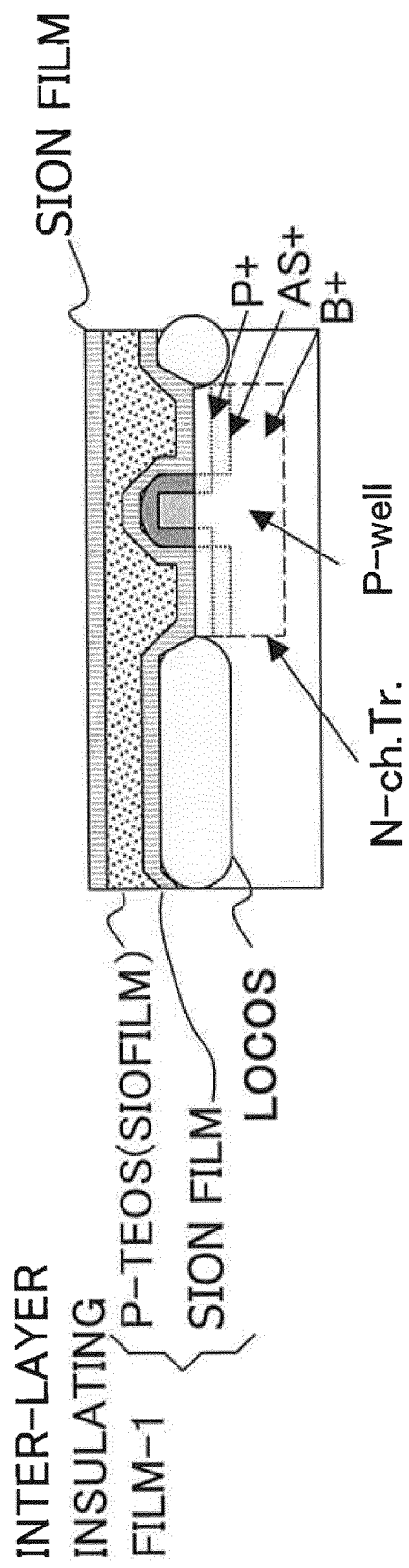
FIG. 9A is a view illustrating how a SiON film serving as an etching stopper is formed.

A working example of the manufacturing process according to the second embodiment will be illustrated with reference to FIGS. 9A-9F. In the embodiment, to begin with, after forming the transistor layer, the SiON film is formed, thereafter the entire surface is coated with the P-TEOS, and the surface is flattened by the CMP. Thereafter, the SiON film serving as the etching stopper is formed (FIG. 9A).

Next, the ferroelectric capacitor, after being formed, is coated with the protective film (AlO film), then the upper layer thereof is covered with the inter-layer insulating film-2, and the surface is flattened (FIG. 9B).

Moreover, the resist is coated, and a resist pattern becoming a bulk contact is formed (FIG. 9C). At this time, a size of the contact hole is set large by a predetermined value.

Figure 9D:
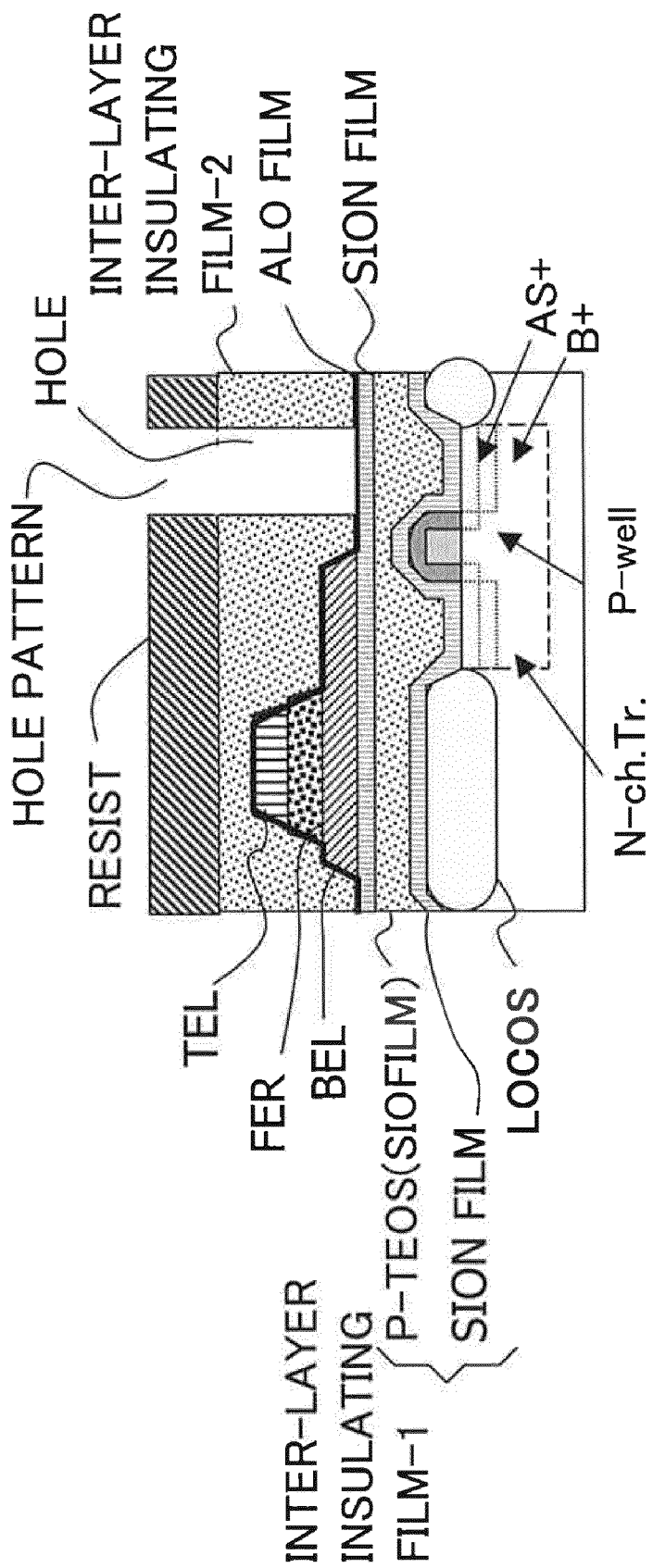
FIG. 9D is a view illustrating how an inter-layer insulating film-2 is etched with the SiON film serving as the etching stopper film.

Then, with the resist pattern serving as a mask, the inter-layer insulating film-2 is etched to form the contact hole (FIG. 9D). At this time, the SiON film is used as the etching stopper film. With this contrivance, the inter-layer insulating film-2 and the protective film are removed.

Next, only the SiON film is etched (FIG. 9E). Then, the high-frequency input power to the lower electrode is set at 500 watts, and the inter-layer insulating film-1 (the SiO film and the SiON film) is taper-etched (FIG. 9F).

As discussed above, according to the manufacturing process of the semiconductor device, the etching stopper film (the SiON film) is formed between the inter-layer insulating film-1 and the ferroelectric capacitor. Accordingly, even when the etching rate largely changes before and after the completion of etching the protective film due to the existence of the protective film (the aluminum oxide film) for protecting the ferroelectric capacitor, the etching stopper film can stably stop the etching.

Further, it may be sufficient that the etching stopper film (the SiON film) is surely removed by the etching gas containing the $CF_4$ gas for etching the etching stopper film. Then, it may also be sufficient that in the same procedure as in the first embodiment, the inter-layer insulating film-1 is etched.

Thus, in the formation of the contact hole, even when the protective film of aluminum exists in the inter-layer insulating film to be formed with the hole, the contact hole can be stably formed based on the etching. Moreover, the etching gas can uniformly permeate the contact hole by conducting the same taper-etching as in the first embodiment, and it is feasible to reduce the variations of the shape and the depth of the contact hole due to the etching.

Accordingly, there is no necessity for increasing the film thickness of the etching stopper film as hitherto done, and it is also possible to reduce the problem of causing a rise in sheet resistance of a hole (which will hereinafter also be called a bulk contact) connected to the bulk layer of the transistor layer.

First Modified Example

Figure 15:
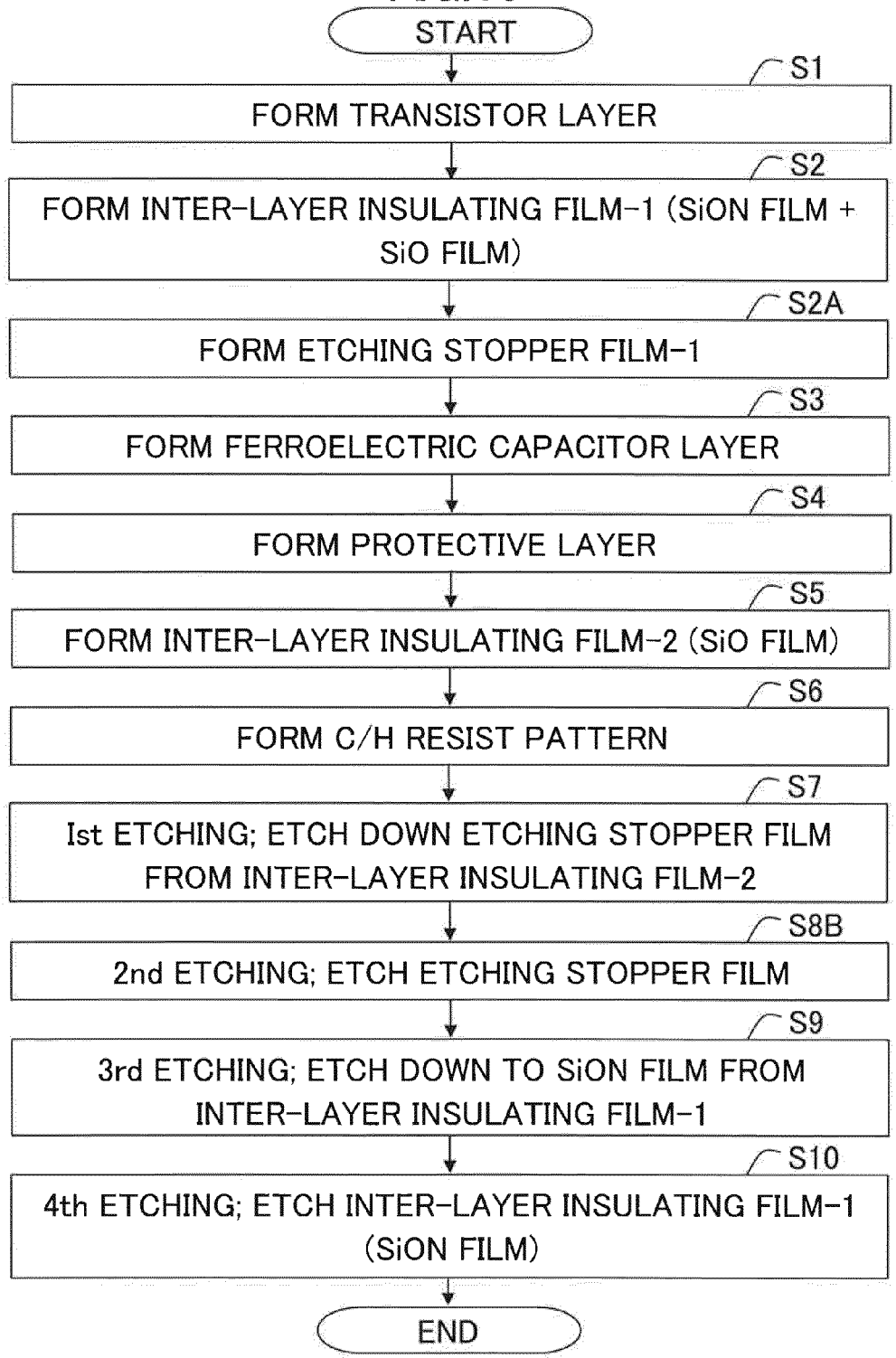
FIG. 15 is a flowchart illustrating a manufacturing process of the semiconductor device according to a first modified example of the second embodiment.

FIG. 15 illustrates the manufacturing process of the semiconductor device according to a first modified example of the second embodiment. In the first modified example, the etching process of the inter-layer insulating film-1 is different from the case in FIG. 14. To be specific, in the case of FIG. 15, similarly to FIG. 11 in the first embodiment, the third etching process (S9) and the fourth etching process (S10) are executed in a way that changes the etching condition respectively for the TEOS film and the SiON film, which constitute the inter-layer insulating film-1. Thus, it may be sufficient that the taper-etching is carried out in the same way as in the first embodiment.

Note that in the processes in S9 and S10, the normal anisotropic etching may be executed without carrying out the taper-etching. This case does not acquire the effect that the etching gas uniformly permeates the contact hole owing to the taper-etching but acquires an effect that the etching stopper stably stops the etching of the protective film.

Second Modified Example

Figure 16:
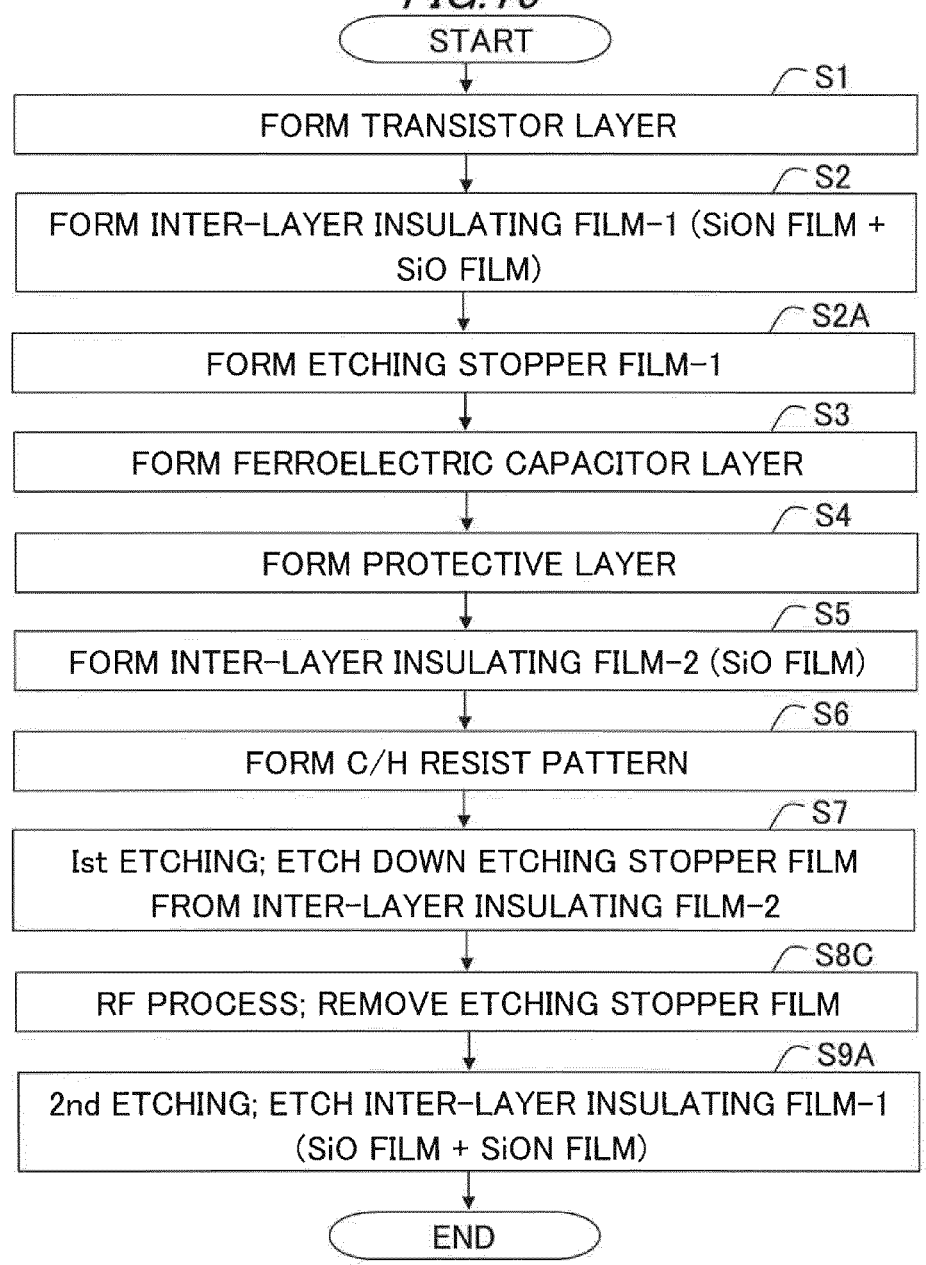
FIG. 16 is a flowchart illustrating a manufacturing process of the semiconductor device according to a second modified example of the second embodiment.

FIG. 16 illustrates the manufacturing process of the semiconductor device according to a second modified example of the second embodiment. The second modified example is different from the case of FIG. 14 in terms of removing the protective film in the high-frequency process. In this case also, similarly to the case of FIG. 14, irrespective of the existence or non-existence of the protective film, the etching stopper film can stably stop the etching of the protective film.

A condition of an RF process for the etching stopper film in this case is the same as the condition in S8A of FIG. 13 in the first embodiment, i.e., the condition for removing the aluminum oxide film.

Third Modified Example

Figure 17:
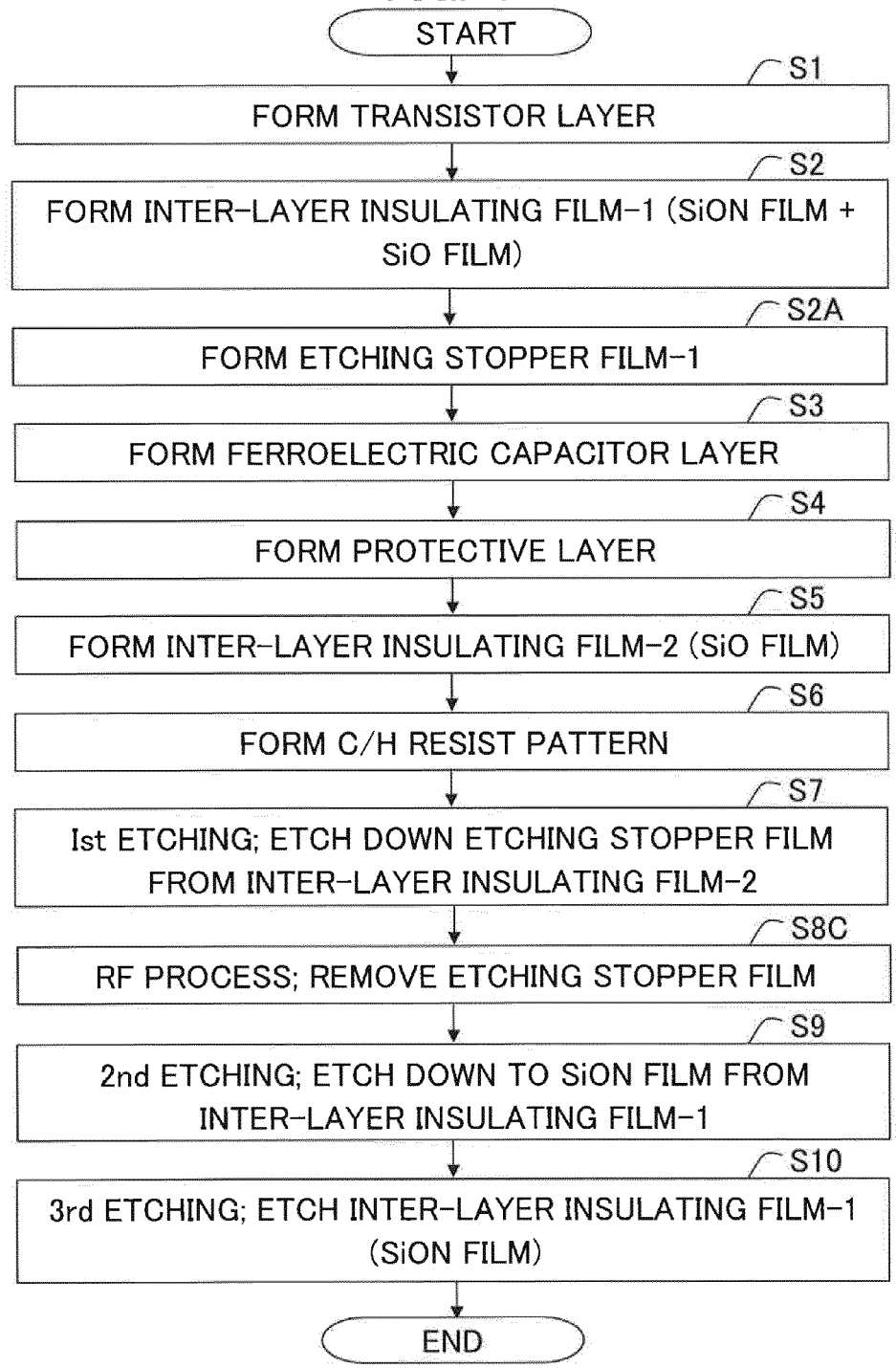
FIG. 17 is a flowchart illustrating a manufacturing process of the semiconductor device according to a third modified example of the second embodiment.

FIG. 17 illustrates the manufacturing process of the semiconductor device according to a third modified example of the second embodiment. In the third modified example, after removing the etching stopper film in the high-frequency process, similarly to the case of FIG. 11, the inter-layer insulating film-1 is etched in separation into the two processes. Specifically, at first, the TEOS film is etched down to the SiON film (S9A), thereafter, the SiON film is etched (S10A), The etching condition in this case is the same as in the case of FIG. 11 and hence the description is omitted.

Third Embodiment

The manufacturing method of the semiconductor device according to a third embodiment will hereinafter be described with reference to the drawing in FIG. 18. In the third embodiment, as compared with the case of the first embodiment, after previously removing the protective film in the position for forming the contact hole, the inter-layer insulating film-2 is formed. Other configurations and operations are the same as those in the case of the second embodiment. This being the case, the same processes and the same components as those in the second embodiment are marked with the same numerals and symbols, and their descriptions are omitted.

<Manufacturing Process>

Figure 18:
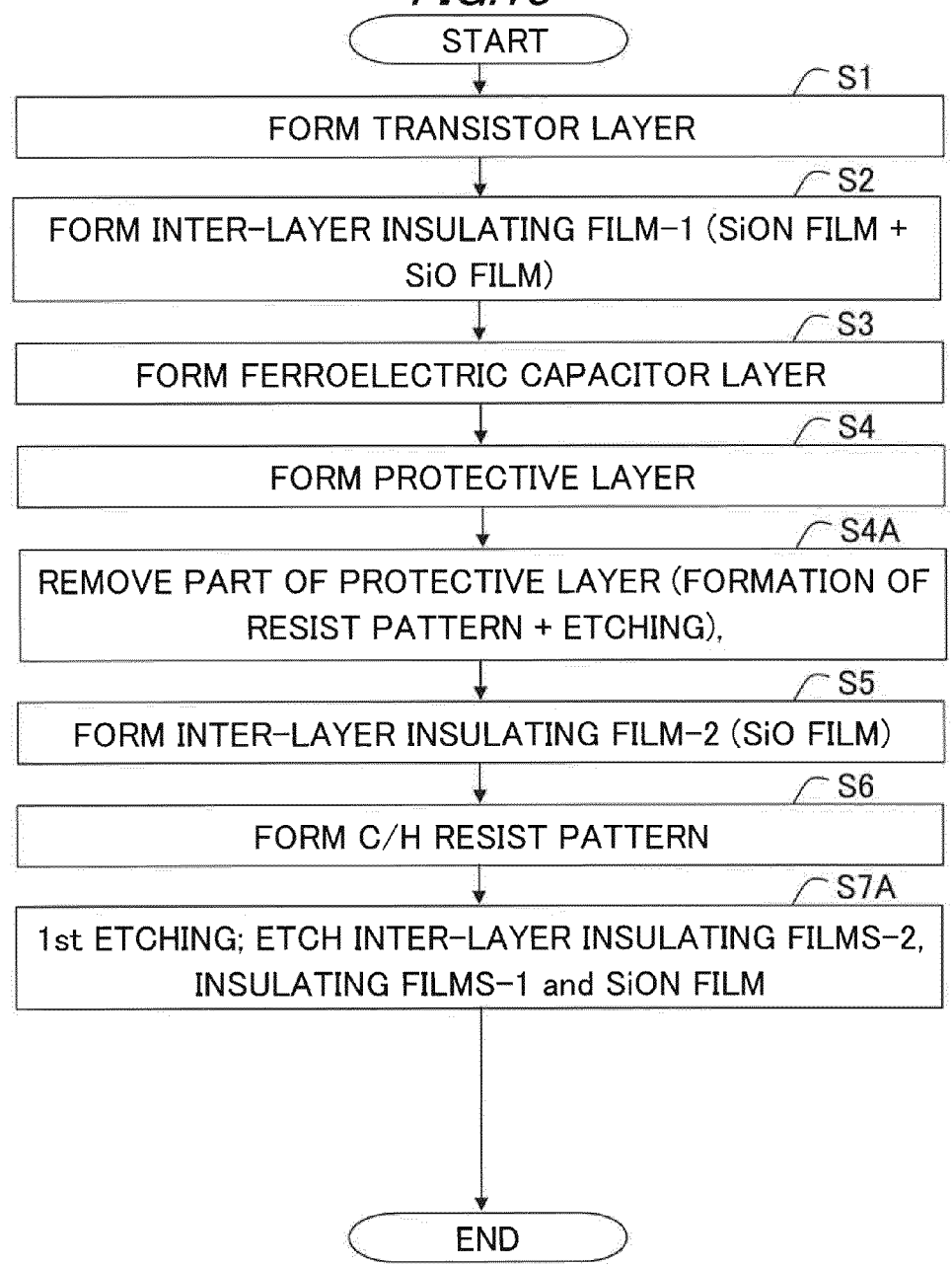
FIG. 18 is a flowchart illustrating a manufacturing process of the semiconductor device according to a third embodiment.

FIG. 18 illustrates the manufacturing process of the semiconductor device according to the third embodiment. Herein, after temporarily forming the protective film (the aluminum oxide film) for the ferroelectric capacitor, a part of the protective film is removed (S4A). The protective film is (partially) removed by forming the resist pattern on the protective film and performing the etching. As for the resist pattern in this case, a portion corresponding to the sectional shape of the contact hole is removed in the position where the contact hole is formed.

Further, the inter-layer insulating film-2 (the SiO film) is formed (S5), the resist pattern of the contact hole is formed (S6), and the contact hole is formed by one etching operation (S7A). In this case, the film becoming the etching stopper does not exist in a region extending from the inter-layer insulating film-2 (the SiO film) formed with the contact hole to the SiO film of the inter-layer insulating film-1. Accordingly, the etching time is set based on the experimental/empirical value of the etching rate of the two SiO films and the SiON film of the inter-layer insulating film-1, and the contact hole is formed.

In this case, similarly to the first embodiment, the taper-etching may also be performed. The execution of the taper-etching accelerates the permeation of the etching gas into the upper portion of the contact hole, and can unformize the shape and the characteristic of the contact hole due to the etching. In this case, in the same way as in the first embodiment, the taper angle of the contact hole is controlled by adjusting the high-frequency power inputted to the lower electrode. The bottom surface portion of the contact hole can be thereby adjusted down to the target value.

First Modified Example

FIG. 19 depicts a (first) modified example of the third embodiment. In this modified example, in the process of FIG. 18, the etching process of the inter-layer insulating film-1 and the inter-layer insulating film-2 is divided into two stages, in which the etching is conducted under etching conditions different from each other. Namely, the first etching process is that the SiO films of the inter-layer insulating film-2 and the inter-layer insulating film-1 are etched, and the etching is stopped by the SiON films (S9B). Each of the etching conditions in this case respectively corresponds to each of the condition (the condition in S7 of FIG. 11) of the first etching process for the inter-layer insulating film-2 in the first embodiment, and the condition (the condition in S9 of FIG. 11) of the third etching process for the inter-layer insulating film-1.

In the case of etching under the condition of the third etching process in FIG. 11, the taper-etching is executed. Accordingly, it follows that the hole dimension of the resist pattern is determined from the film thicknesses of the SiO films of the inter-layer insulating film-2 and the inter-layer insulating film-1, the taper angle and the sectional dimension of the bottom surface portion. Alternatively, the necessary taper angle is determined from the film thicknesses of the SiO films of the inter-layer insulating film-2 and the inter-layer insulating film-1, the sectional dimension of the bottom surface portion and the hole dimension of the resist pattern, and the high-frequency power to the lower electrode may also be determined corresponding to the thus-determined taper angle.

Next, the SiON film is etched (S10B). The contact hole is thereby connected to the transistor layer.

As discussed above, according to the manufacturing process of the semiconductor device in the third embodiment, after forming the protective film for the ferroelectric capacitor, the protective film is partially removed. Namely, in the next process, the protective film in the position, which should be formed with the contact hole, is previously removed. With this contrivance, it is possible to avoid a problem that an etching selective ratio decreases due to the existence of the protective film on the occasion of forming the contact hole. Further, it is also feasible to avoid a problem that the etching rate largely fluctuates before and after the completion of etching the protective film. Hence, also in the semiconductor device including the ferroelectric capacitor requiring the protective film, the contact hole having the stable shape and characteristic can be formed.

Moreover, the etching gas can uniformly permeate the contact hole by performing the same taper-etching as in the first embodiment, and the variations of the shape and the depth of the contact hole due to the etching can be reduced. The present manufacturing method is effective especially in manufacturing the semiconductor device requiring the contact hole having the high aspect ratio, which includes the ferroelectric capacitor.

Fourth Embodiment

The manufacturing method of the semiconductor device according to a fourth embodiment will hereinafter be described with reference to the drawings in FIGS. 10A-10F and FIG. 20. In the fourth embodiment, as compared with the second embodiment, after previously removing the protective film in the position where the contact hole is formed, the inter-layer insulating film-2 is formed. This corresponds to the configuration having the etching stopper film in the semiconductor device in the third embodiment.

Other configurations and operations are the same as those in the case of the second embodiment. This being the case, the same processes and the same components as those in the second embodiment are marked with the same numerals and symbols, and their descriptions are omitted.

<Manufacturing Process>

FIG. 20 illustrates the manufacturing process of the semiconductor device according to the fourth embodiment. Herein, after forming the protective film (the aluminum oxide film) for the ferroelectric capacitor, a part of the protective film is removed (S4A). The protective film is removed by forming the resist pattern on the protective film and performing the etching. Moreover, the inter-layer insulating film-2 (SiO film) is formed (S5), and the resist pattern of the contact hole is formed (S6).

Then, the inter-layer insulating film-2 is etched, and the etching stopper film stops the etching (S7) Next, the etching stopper film is etched (S8D). Further, the inter-layer insulating film-1 is etched in one etching process (S9C).

In this case, similarly to the first embodiment, the taper-etching may also be conducted. The execution of the taper-etching can accelerate the permeation of the etching gas into the upper portion of the contact hole, uniformize the formation of the contact hole due to the etching, and set the bottom surface portion of the contact hole to the design value.

Moreover, even if not taper-etched, the etching stopper film temporarily stops the etching, the condition is changed to the etching condition for the etching stopper film, and the variations of the hole shape and the hole depth are reduced by further etching the inter-layer insulating film-1, thus enabling the contact hole to be formed.

Working Example

Figure 10B:
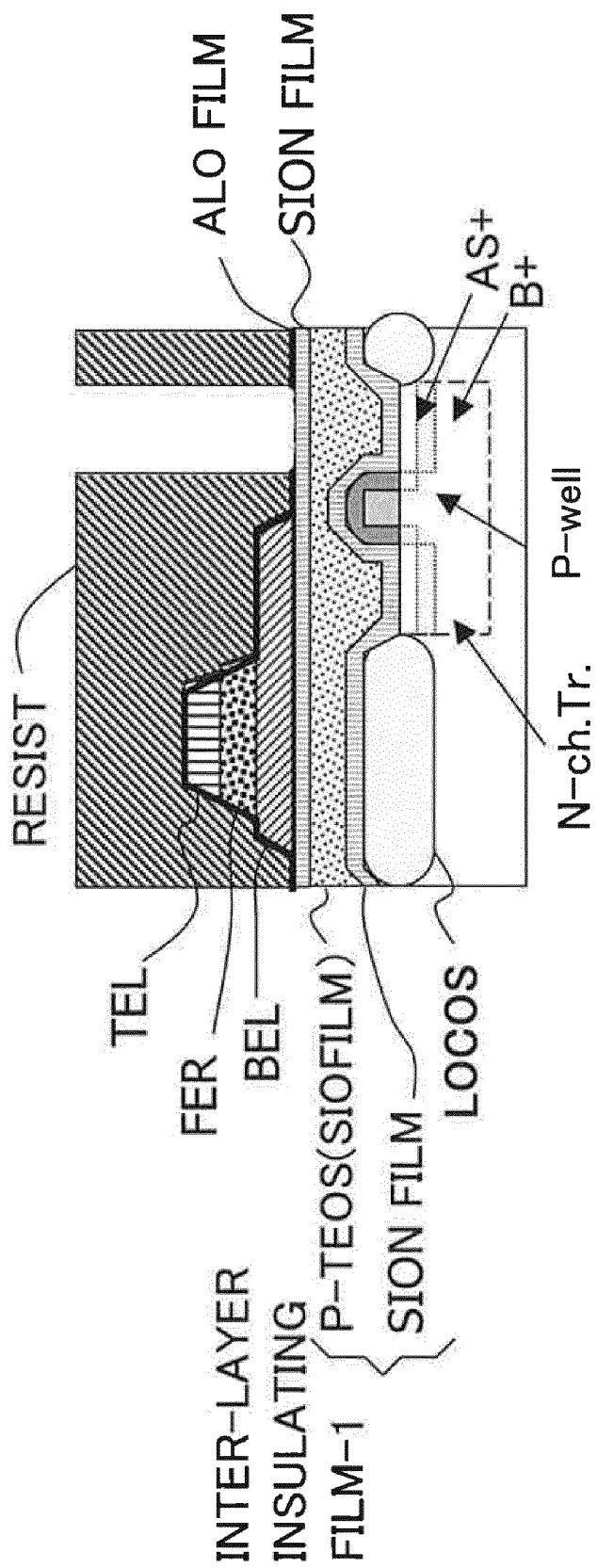
FIG. 10B is a view illustrating how a protective layer is etched.

A working example of the manufacturing process according to the fourth embodiment is illustrated with reference to FIGS. 10A-10F. In the fourth embodiment, to start with, after forming the transistor layer, the SiON film is formed, the entire surface is thereafter covered with the P-TEOS, and the surface is flattened by the CMP. Thereafter, the SiON film becoming the etching stopper is formed (FIG. 10A).

Next, after forming the ferroelectric capacitor, the protective film (the aluminum oxide film) is formed. Furthermore, the resist pattern is formed to the sectional dimension of the bulk contact, and the protective film is etched (FIG. 10B). Then, the resist is removed.

Subsequently, the ferroelectric capacitor is covered with the inter-layer insulating film-2, and the surface thereof is flattened. Moreover, the resist is coated, and the resist pattern becoming the bulk contact is formed. At this time, a size of the contact hole is set large (FIG. 10C).

Figure 10D:
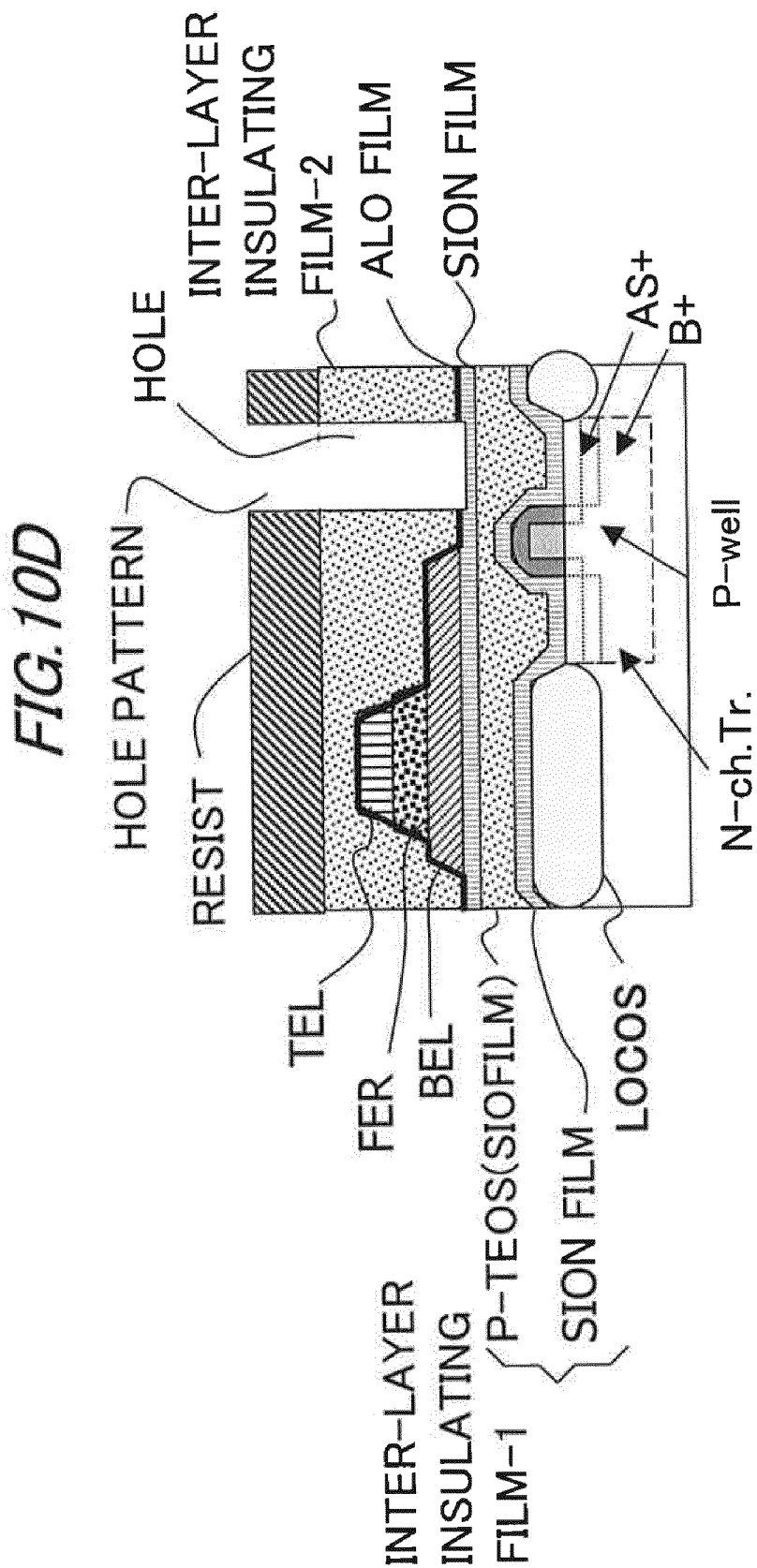
FIG. 10D is a view illustrating how the inter-layer insulating film-2 is etched with the SiON film serving as the etching stopper film.
Figure 10E:
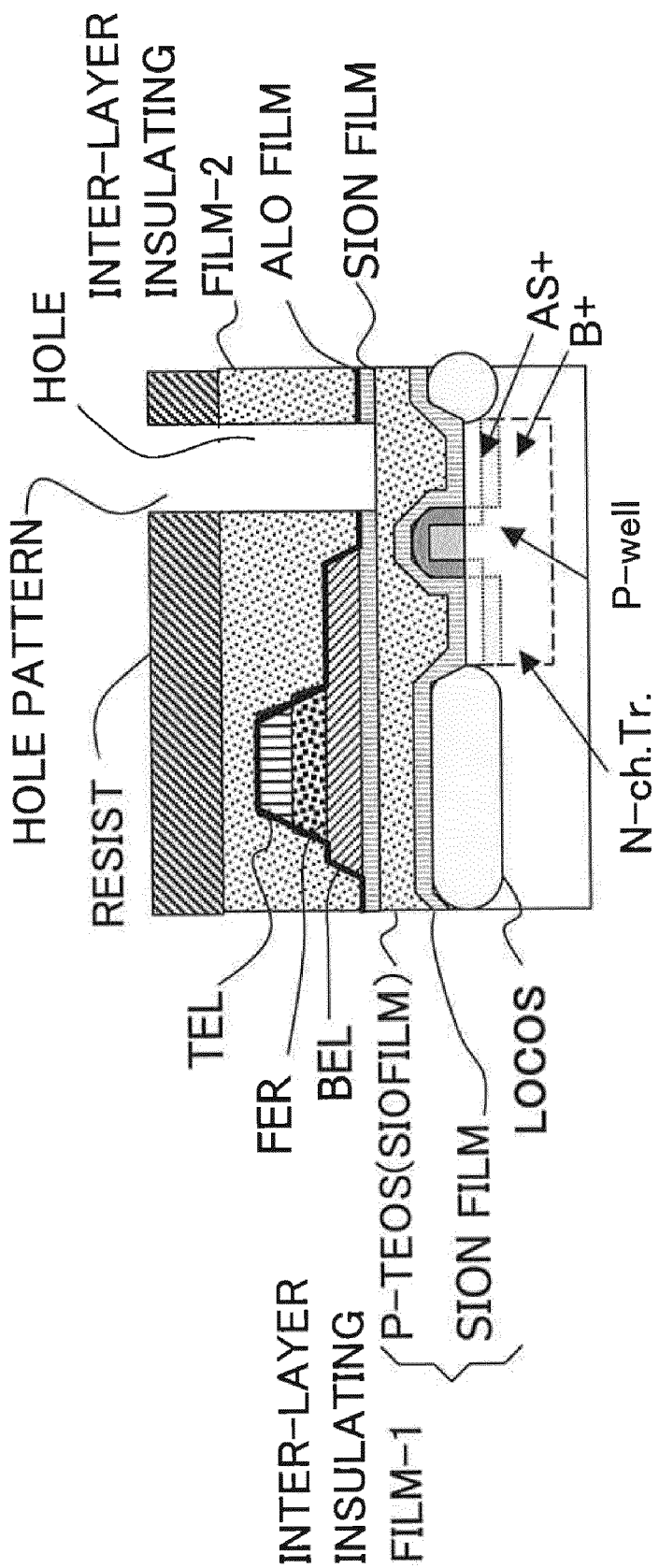
FIG. 10E is a view illustrating how the SiON film is etched.

Then, with the resist pattern serving as the mask, the inter-layer insulating film-2 is etched to form the contact hole (FIG. 10D). At this time, the SiON film is provided as the etching stopper film.

Next, only the SiON film is etched (FIG. 10E) Then, the taper-etching is carried out in a way that changes the flow rate of the etch gas (FIG. 10F). Note that in the process of FIG. 10E, the inter-layer insulating film-1 in FIG. 10F may also be etched.

As described above, according to the manufacturing process of the semiconductor device in the fourth embodiment, the etching stopper film (the SiON film) is formed between the inter-layer insulating film-1 and the ferroelectric capacitor. Further, the protective film (the aluminum oxide film) in the position, where the hole is formed, is removed beforehand. Therefore, on the occasion of etching the hole, the etching target layer has none of the protective film for protecting the ferroelectric capacitor. Accordingly, such a problem does not arise that the etching rate largely changes before and after the completion of etching the protective film. Moreover, the etching stopper film can stably stop the etching.

Further, it may be sufficient that the etching stopper film (the SiON film) is surely removed by the etching gas containing the CF$_4$ gas for etching this etching stopper film. Then, it may also suffice that the inter-layer insulating film-1 is etched in the same procedure as in the first embodiment.

Thus, also in the semiconductor device including the ferroelectric capacitor requiring the protective film, in the formation of the contact hole, it may be sufficient that the protective film is removed from within the inter-layer insulating film in the position where the hole is formed.

As discussed above, according to the manufacturing method of the semiconductor device in the fourth embodiment, after forming the protective film for the ferroelectric capacitor, the protective film is partially removed. To be specific, in the next process, the protective film in the position, which should be formed with the contact hole, is removed beforehand. With this contrivance, on the occasion of forming the contact hole, the problem that the etching selective ratio decreases, which is caused by the existence of the protective film, is restrained. Moreover, it is feasible to avoid the problem that the etching rate largely fluctuates before and after the completion of etching the protective film. Accordingly, also in the semiconductor device including the ferroelectric capacitor requiring the protective film, it is possible to form the contact hole having the stable shape and characteristic.

Furthermore, the etching gas can uniformly permeate the contact hole by executing the same taper-etching as in the first embodiment, and the variations of the shape and the depth of the contact hole due to the etching can be reduced. The present manufacturing method is effective particularly in manufacturing the semiconductor device requiring the contact hole having the high aspect ratio, which includes the ferroelectric capacitor.

Other Modified Examples

In the first embodiment through the fourth embodiment, the aluminum oxide film ($Al_2O_3$ film) is used as the protective film for the ferroelectric capacitor. The protective film is not, however, limited to the aluminum oxide film. For example, the protective film may involve using an AlxOy film, a $TiO_2$ film, a TiOx film, a ZrOx film, a MgOx film, a MgTiOx film, etc. Herein, "x" and "y" are integers larger than 0.

Moreover, in the second embodiment through the fourth embodiment, the SiON film is employed as the etching stopper film. The etching stopper film is not, however, limited to the SiON film. For instance, a SiN film may also be used as the protective film.

The aspect of the embodiment includes the first etching step of forming the hole by etching the second inter-layer insulating film and the second etching step of extending the hole down to the first element layer by etching the first inter-layer insulating film, and therefore enables the formation of the stable contact hole even when an aluminum oxide film exists in the middle of a layer formed with the contact hole.

All example and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. A manufacturing method of a semiconductor device, comprising:
    forming an element layer on a semiconductor substrate;
    forming a first inter-layer insulating film on the element layer;
    forming a ferroelectric capacitor layer on the first inter-layer insulating film;
    forming a protective-stopper film on the ferroelectric capacitor layer;
    forming a second inter-layer insulating film on the protective-stopper film;
    forming a resist pattern of a hole on the second inter-layer insulating film;
    forming the hole by etching the second inter-layer insulating film with an etching condition in which the forming the hole is to be stopped at the protective-stopper film;
    removing the protective-stopper film under the hole; and
    extending the hole down to the element layer by etching the first inter-layer insulating film.

2. The manufacturing method of a semiconductor device according to claim 1, wherein the extending hole includes etching to form a section of the hole with a first sectional dimension in a vicinity of an upper surface of the first inter-layer insulating film, and etching to form a section of the hole with a second sectional dimension smaller than the first sectional dimension in a vicinity of the element layer.

3. The manufacturing method of a semiconductor device according to claim 1, wherein the first inter-layer insulating film includes a first insulating film formed on the element layer, and a second insulating film containing a component different from the first insulating film and formed on the first insulating film, and
    the extending the hole includes etching the second insulating film, and etching the first insulating film under an etching condition different from that of the etching the second insulating film.

4. The manufacturing method of a semiconductor device according to claim 3, wherein the etching the second insulating film includes etching to form a section of the hole with a first sectional dimension in a vicinity of an upper surface of the second insulating film, and etching to form a section of the hole with a third sectional dimension smaller than the first sectional dimension in a vicinity of the first insulating film.

5. The manufacturing method of a semiconductor device according to claim 3, wherein the etching the second insulating film includes etching to form a section of the hole with a first sectional dimension in a vicinity of an upper surface of the second insulating film, and forming a section of the hole with a third sectional dimension smaller than the first sectional dimension in a vicinity of the first insulating film, and
    the etching the first insulating film includes etching to form a section of the hole with the third sectional dimension in a vicinity of an upper surface of the first insulating film, and forming a section of the hole with a second sectional dimension further smaller than the third sectional dimension in a vicinity of the element layer.

6. The manufacturing method of a semiconductor device according to claim 1, wherein the removing the protective film includes removing the protective film by etching or with a high-frequency process.

7. A manufacturing method of a semiconductor device, comprising:
    forming an element layer on a semiconductor substrate;
    forming a first inter-layer insulating film on the element layer;
    forming an etching stopper film on the first inter-layer insulating film;
    forming a ferroelectric capacitor layer on the etching stopper film;
    forming a protective film on the ferroelectric capacitor layer;
    forming a second inter-layer insulating film on the protective film;
    forming a resist pattern of a hole on the second inter-layer insulating film;
    forming the hole by etching down to an upper layer of the etching stopper film from the second inter-layer insulating film;
    removing the etching stopper film under the hole; and
    extending the hole down to the element layer by etching the first inter-layer insulating film under the hole.

8. The manufacturing method of a semiconductor device according to claim 7, wherein the extending the hole down to the element layer includes etching to form a section of the hole with a first sectional dimension in a vicinity of an upper surface of the first inter-layer insulating film, and forming a section of the hole with a second sectional dimension smaller than the first sectional dimension in a vicinity of the element layer.

9. The manufacturing method of a semiconductor device according to claim 7, wherein the first inter-layer insulating film includes a first insulating film formed on the element layer, and a second insulating film containing a component different from the first insulating film and formed on the first insulating film, and
the extending the hole down to the element layer includes etching the second insulating film, and etching the first insulating film under an etching condition different from that of the etching the second insulating film.

10. The manufacturing method of a semiconductor device according to claim 9, where in the etching the second insulating film includes etching to form a section of the hole with a first sectional dimension in a vicinity of an upper surface of the second insulating film, and forming a section of the hole with a third sectional dimension smaller than the first sectional dimension in a vicinity of the first insulating film.

11. The manufacturing method of a semiconductor device according to claim 9, wherein the etching the second insulating film includes etching to form a section of the hole with a first sectional dimension in a vicinity of an upper surface of the second insulating film, and etching to form a section of the hole with a third sectional dimension smaller than the first sectional dimension in a vicinity of the first insulating film, and
the etching the first insulating film includes etching to form a section of the hole with the third sectional dimension in a vicinity of an upper surface of the first insulating film, and etching to form a section of the hole with a second sectional dimension further smaller than the third sectional dimension in a vicinity of the element layer.

12. The manufacturing method of a semiconductor device according to claim 7, wherein the removing the etching stopper film under the hole includes removing the etching stopper film by etching or with a high-frequency process.

13. A manufacturing method of a semiconductor device, comprising:
forming an element layer on a semiconductor substrate;
forming a first inter-layer insulating film on the element layer;
forming a ferroelectric capacitor layer on the first inter-layer insulating film;
forming a protective film on the ferroelectric capacitor layer;
removing a part of the protective film before forming a second inter-layer insulating film;
forming the second inter-layer insulating film on the protective film including the removed part;
forming a resist pattern of a hole on the second inter-layer insulating film; and
etching the first inter-layer insulating film and the second inter-layer insulating film to form a hole penetrating a portion with the protective film being removed, down to the element layer.

14. The manufacturing method of a semiconductor device according to claim 13, wherein the etching the first inter-layer insulating film and the second inter-layer insulating film includes etching to form a section of the hole with a first sectional dimension in a vicinity of an upper surface of the first inter-layer insulating film, and etching to form a section of the hole with a second sectional dimension smaller than the first sectional dimension in a vicinity of the element layer.

15. The manufacturing method of a semiconductor device according to claim 13, wherein the first inter-layer insulating film includes a first insulating film formed on the element layer, and a second insulating film containing a component different from the first insulating film and formed on the first insulating film, and
the etching the first inter-layer insulating film and the second inter-layer insulating film includes etching the second insulating film, and etching the first insulating film under an etching condition different from that of the etching the second insulating film.

16. The manufacturing method of a semiconductor device according to claim 15, wherein the etching the second insulating film includes etching to form a section of the hole with a first sectional dimension in a vicinity of an upper surface of the second insulating film, and etching to form a section of the hole with a third sectional dimension smaller than the first sectional dimension in a vicinity of the first insulating film.

17. The manufacturing method of a semiconductor device according to claim 15, wherein the etching the second insulating film includes etching to form a section of the hole with a first sectional dimension in a vicinity of an upper surface of the second insulating film, and etching to form a section of the hole with a third sectional dimension smaller than the first sectional dimension in a vicinity of the first insulating film, and
the etching the first insulating film includes etching to form a section of the hole with the third sectional dimension in a vicinity of the upper surface of the first insulating film, and etching to form a section of the hole with a second sectional dimension further smaller than the third sectional dimension in a vicinity of the element layer.

18. The manufacturing method of a semiconductor device according to claim 13, wherein the removing the part of the protective film includes removing the protective film by etching or with a high-frequency process.

19. A manufacturing method of a semiconductor device, comprising:
forming an element layer on a semiconductor substrate;
forming a first inter-layer insulating film on the element layer;
forming an etching stopper film on the first inter-layer insulating film;
forming a ferroelectric capacitor layer on the etching stopper film;
forming a protective film on the ferroelectric capacitor layer;
removing a part of the protective film;
forming a second inter-layer insulating film on the protective film including the removed part;
forming a resist pattern on the second inter-layer insulating film;
forming a hole by etching down to an upper layer of the etching stopper film from the second inter-layer insulating film;
removing the etching stopper film; and
extending the hole down to the element layer by etching the first inter-layer insulating film.

20. The manufacturing method of a semiconductor device according to claim 19, wherein the extending the hole down to the element layer includes etching to form a section of the hole with a first sectional dimension in a vicinity of an upper surface of the first inter-layer insulating film, and etching to form a section of the hole with a second sectional dimension smaller than the first sectional dimension in a vicinity of the element layer.

21. The manufacturing method of a semiconductor device according to claim 19, wherein the first inter-layer insulating film includes a first insulating film formed on the element layer, and a second insulating film containing a component different from the first insulating film and formed on the first insulating film, and the extending the hole down to the element layer includes etching the second insulating film, and etching the first insulating film under an etching condition different from that of the etching the second insulating film.

22. The manufacturing method of a semiconductor device according to claim 21, wherein the etching the second insulating film includes etching to form a section of the hole with a first sectional dimension in a vicinity of an upper surface of the second insulating film, and forming a section of the hole with a third sectional dimension smaller than the first sectional dimension in a vicinity of the first insulating film.

23. The manufacturing method of a semiconductor device according to claim 21, wherein etching the second insulating film includes etching to form a section of the hole with a first sectional dimension in a vicinity of an upper surface of the second insulating film, and forming a section of the hole with a third sectional dimension smaller than the first sectional dimension in a vicinity of the first insulating film, and the etching the first insulating film includes etching to form a section of the hole with the third sectional dimension in a vicinity of the upper surface of the first insulating film, and etching to form a section of the hole with a second sectional dimension further smaller than the third sectional dimension in a vicinity of the element layer.

24. The manufacturing method of a semiconductor device according to claim 19, wherein the removing the etching stopper film includes removing the etching stopper film by etching or with a high-frequency process.

25. The manufacturing method of a semiconductor device according to claim 1, wherein the protective film is any one of an $Al_2O_3$ film, an AlxOy film, a $TiO_2$ film, a TiOx film, a ZrOx film, a MgOx film, a MgTiOx film, etc (where "x" and "y" are positive integers).

26. The manufacturing method of a semiconductor device according to claim 1, wherein the protective film has a film thickness that is equal to or larger than at least 20 nanometers but smaller than 100 nanometers.

27. The manufacturing method of a semiconductor device according to claim 7, wherein the etching stopper film is a SiN film or a SiON film.

28. The manufacturing method of a semiconductor device according to claim 7, wherein the etching stopper film has a film thickness that is equal to or larger than 30 nanometers but smaller than 150 nanometers.

29. The manufacturing method of a semiconductor device according to claim 6, wherein the high-frequency process includes cutting off the resist and the contact hole by use of an Ar gas with a PVD (Physical Vapor Deposition) apparatus.

30. The manufacturing method of a semiconductor device according to claim 6, wherein a target value of a polishing quantity in the high-frequency process is 1.0 through 1.5 times as large as a film thickness of a removing target film.

31. The manufacturing method of a semiconductor device according to claim 1, wherein in the extending the hole, high-frequency input power to a lower electrode, which generates a bias potential with respect to plasma in an etching apparatus, is controlled to approximately ⅔ or less of the power in the case of executing an anisotropic etching process.

32. The manufacturing method of a semiconductor device according to claim 2, wherein the first sectional dimension is set 1.3 through 1.5 times as large as the second sectional dimension.

33. The manufacturing method of a semiconductor device according to claim 1, wherein the hole includes a first hole portion abutting on the element layer and a second hole portion formed on the first hole portion, and the first hole portion has a larger inclination of a tapered surface which tapers off in a depthwise direction than the second hole portion has.

* * * * *